United States Patent
Bioglio et al.

(10) Patent No.: US 11,894,862 B2
(45) Date of Patent: Feb. 6, 2024

(54) METHOD AND DEVICE FOR POLAR CODE ENCODING AND DECODING

(71) Applicant: Huawei Technologies Co., Ltd., Shenzhen (CN)

(72) Inventors: Valerio Bioglio, Boulogne Billancourt (FR); Carlo Condo, Munich (DE)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 17/566,338

(22) Filed: Dec. 30, 2021

(65) Prior Publication Data
US 2022/0123767 A1  Apr. 21, 2022

Related U.S. Application Data

(63) Continuation of application No. PCT/EP2019/067865, filed on Jul. 3, 2019.

(51) Int. Cl.
*H03M 13/00* (2006.01)
*H03M 13/39* (2006.01)

(52) U.S. Cl.
CPC ...... *H03M 13/616* (2013.01); *H03M 13/3972* (2013.01)

(58) Field of Classification Search
CPC .................................................. H03M 13/616
See application file for complete search history.

(56) References Cited

U.S. PATENT DOCUMENTS

| | | | |
|---|---|---|---|
| 2014/0169492 A1* | 6/2014 | Mahdavifar | H03M 13/13 375/267 |
| 2018/0205496 A1* | 7/2018 | Kudekar | H04L 1/0057 |
| 2019/0052418 A1* | 2/2019 | Li | H04L 1/1819 |

OTHER PUBLICATIONS

Bin Li, Huazi Zhang, Jiaqi Gu; On Pre-transformed Polar; Published Dec. 13, 2019, Computer Science, ArXiv (Year: 2019).*
MediaTek Inc., "Resolving Polar Code Memory Complexity Issue," 3GPP TSG RAN WG1 Meeting #86bis, Lisbon, Portugal, R1-1609338, XP051149381, total 6 pages, 3rd Generation Partnership Project, Valbonne, France (Oct. 10-14, 2016).

(Continued)

*Primary Examiner* — Joseph D Torres
(74) *Attorney, Agent, or Firm* — Leydig, Voit & Mayer, Ltd.

(57) ABSTRACT

The disclosure relates to generating a polar code and also to encoding and decoding data using a polar code. A method of generating a polar code includes obtaining a first matrix as an m-fold Kronecker product of a 2×2 binary lower triangular matrix where m=log 2(M/2), M<N, and N is the length of a polar code to be generated. A second matrix may be obtained, where the inverse of the second matrix is a lower triangular band matrix. A transformation matrix may be generated for the polar code by calculating a Kronecker product of the second matrix with the first matrix. An information set I identifying reliable bit channels for the polar code may be determined. A polar codeword of length N may be obtained using the polar code that is decodable by iteratively applying a sliding decoding window of length M to the polar codeword.

14 Claims, 24 Drawing Sheets

(56) References Cited

OTHER PUBLICATIONS

Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073, IEEE, Institute of Electrical and Electronics Engineers, New York, New York (Jul. 2009).

Feng et al., "A Novel High-Rate Polar-Staircase Coding Scheme," XP033535199, 2018 IEEE 88th Vehicular Technology Con Ference (VTC-Fall), total 5 pages, IEEE, Institute of Electrical and Electronics Engineers, New York, New York (Aug. 27, 2018).

Gabry et al., "Multi-Kernel Construction of Polar Codes," 2017 IEEE International Conference on Communications Workshops (ICC Workshops), Paris, ICC2017: WT09-Channel Coding for 5G and Future Networks, total 5 pages, IEEE, Institute of Electrical and Electronics Engineers, New York, New York (2017).

Chiu et al., "Polynomial Representations of Polar Codes and Decoding under Overcomplete Representations," XP011536138, IEEE Communications Letters, vol. 17, No. 12, pp. 2340-2343, IEEE, Institute of Electrical and Electronics Engineers, New York, New York (Dec. 2013).

Tal et al., "List Decoding of Polar Codes," IEEE Transactions on Information Theory, vol. 61, No. 5, total 11 pages (May 2012).

Ye et al., "Concatenations of Systematic Polar Codes With Inner Repeat Accumulate Codes," XP032920928, 2016 25th Wireless and Optical Communication Conference (WOCC), total 4 pages, IEEE, Institute of Electrical and Electronics Engineers, New York, New York (2016).

Afisiadis et al., "A Low-Complexity Improved Successive Cancellation Decoder for Polar Codes," in Asilomar Conf. on Signals, Syst., and Comput., pp. 2116-2120, IEEE, Institute of Electrical and Electronics Engineers, New York, New York (Nov. 2014).

Lin et al., "Linear and Nonlinear Binary Kernels of Polar Codes of Small Dimensions With Maximum Exponents," XP011668704, IEEE Transactions on Information Theory, vol. 61, No. 10, pp. 5253-5269, Institute of Electrical and Electronics Engineers, New York, New York (Oct. 2015).

Vangala et al., "A Comparative Study of Polar Code Constructions for the AWGN Channel," in arXiv preprint arXiv:1501.02473, pp. 1-9 (2015).

Ha et al., "Rate-Compatible Puncturing of Low-Density Parity-Check Codes," IEEE Transactions on Information Theory, vol. 50, No. 11, pp. 2824-2836 (Nov. 2004).

\* cited by examiner $$T = W_4 \otimes T_4 =$$

$$W_4 = \begin{pmatrix} 0 & 0 & 0 & 1 \\ 0 & 0 & 1 & 1 \\ 0 & 1 & 1 & 1 \\ 1 & 1 & 1 & 1 \end{pmatrix}$$

$$T_4 = \begin{pmatrix} 0 & 0 & 0 & 1 \\ 0 & 0 & 1 & 1 \\ 0 & 1 & 0 & 1 \\ 1 & 1 & 1 & 1 \end{pmatrix}$$

FIG. 7

METHOD AND DEVICE FOR POLAR CODE ENCODING AND DECODING

CROSS-REFERENCE TO RELATED APPLICATIONS

This application is a continuation of International Application No. PCT/EP2019/067865, filed on Jul. 3, 2019, the disclosure of which is hereby incorporated by reference in its entirety.

TECHNICAL FIELD

Embodiments of the present application relate to encoding and decoding data. More particularly, but not exclusively, embodiments of the present application relate to generating a polar code and also to encoding and decoding data using such a polar code.

BACKGROUND

Channel codes are essential in all digital communications systems. A system for forward error correction (FEC) coding, also called a coding scheme, consists of an encoder at the transmitter side and a decoder at the receiver side. The encoder adds redundancy to the data to be transmitted, i.e. additional redundant data, and the decoder exploits this redundancy to correct transmission errors, such that the receiver obtains the transmitted data free of errors despite the noisy communication channel.

Polar codes are linear block codes that rely on the polarization effect, which allows to sort the bit positions of u, called bit-channels, in order of reliability.

As the code length goes toward infinity, the polarization phenomenon influences the reliability of bit-channels, which are either completely noisy or completely noiseless. Furthermore, the fraction of noiseless bit-channels equals the channel capacity.

For finite practical code lengths, the polarization of bit-channels is incomplete. Therefore, there are bit-channels that are partially noisy. The polar encoding process consists in the classification of the bit-channels in an input vector u into two groups: the K good bit-channels that will carry the information bits and are indexed by the information set I, and the N−K bad bit-channels that are fixed to a predefined value (usually 0) and are indexed by the frozen set F. In case of finite code lengths, the K best bit-channels, i.e. the ones with the highest reliability, are selected to form the information set, while the remaining bit-channels are frozen.

Polar codes are based on the fundamental kernel matrix $$T_2 = \begin{bmatrix} 1 & 0 \\ 1 & 1 \end{bmatrix}.$$

Encoding of such a polar code of length $N=2^\mu$ and information length K is as follows. The frozen F of size N−K is chosen, as described above. The bits $u_i$ of the input vector u are set to 0 for $i \in F$ and to the information bits otherwise. The codeword x is computed as x=uT with the transformation matrix $T={_2}^{\otimes n}$, denoting the n-fold Kronecker product.

The reliability of the channels can be determined according to the Bhattacharyya parameter $$Z(W) = \sum_{y \in Y} \sqrt{W(y|0)W(y|1)}$$

Where W is a binary memoryless symmetric channel, and W(y|0), W(y|1) are transition probabilities, Y is the output alphabet and Z is the Bhattacharyya parameter. The lower the Bhattacharyya parameter, the more reliable the channel. Other methods may be used to estimate bit-channel reliabilities. For example, a density evolution method (DE) may be used and for Additive white Gaussion noise (AWGN) channels reliabilities may be determined according to Gaussian approximation (GA). Other categories of noisy channels may be modelled such as a binary summetric channel (BSC) or a binary erasure channel (BEC), for example, using monte-carlo statistical methods.

Generally, different kernels of different sizes can be introduced in the code design, obtaining a multi-kernel polar code. When different kernels are used, the transformation matrix takes the form $T=T_a \otimes T_b \otimes \ldots \otimes T_g$, where the suffixes a-g denote different kernel matrices, and the frozen set F has to be calculated accordingly.

Polar code decoding is based on Successive Cancellation (SC) decoding algorithm, which is inherently sequential. In SC decoding, the decoding is performed bit by bit. It can be viewed as a binary tree search, where bits are estimated at leaf nodes, and the tree is traversed depth-first, with priority given to the left branch. In SC decoding, the decoder starts with a hard decision for a first bit $u_1$ of the input vector u and feeds this decision back into the decoding process. Then a hard decision is made for second bit $u_2$ and the decision made for bit $u_2$ is fed back into the decoding process. Decoding proceeds in this fashion until a decision is obtained for the last bit $u_N$ such that an estimation is made of all of the bits of the input vector u.

SC list decoding (SCL) is an enhanced version of SC where multiple paths are followed during the decoding, and where the decision on the value of bits of the input vector are postponed to the end of the decoding process. Further error correction performance can be added with the help of a CRC applied as an outer code concatenated with the polar code.

SUMMARY

In a first aspect, a method of decoding a received signal is provided comprising applying, at a first position, a window of length M to a received signal containing N signal values, where M<N, decoding a first sub-input vector using a polar code and first channel likelihoods L based on signal values obtained from the window at the first position, shifting the window position to a second position, obtaining second channel likelihoods L based on the signal values from the window at the second position and the decoded first sub-input vector, and decoding a second sub-input vector using a polar code and the second channel likelihoods.

Consider the communication between a transmitter and a receiver having different computational capabilities, namely when the receiver is less powerful than the transmitter, e.g. the downlink in a wireless communication. The transmitter is able to create polar codewords of length N, while the receiver can handle only polar codewords of length M<N.

One possible solution to this problem is to divide the information in S=N/M blocks and transmit separately each block on a different codeword of length M. However, it is well known that independent transmissions increase the block error rate of the system, since information is correctly recovered only if all the S codewords are decoded correctly; even a single error in one of the transmissions results in an overall decoding failure.

By applying a moving decoding window of length M, where M<N, and decoding using a polar code based on the windowed values. A decoder with computational capacity M that is less than the capacity N of, for example, an encoder may still decode a polar codeword of length N received in a single transmission. This is made possible by the feedback of the already decoded sub-input vector at the first window position in obtaining the second channel likelihoods at the second window position from which a second sub-input vector is decoded.

Such a decoding procedure improves block error rate (BLER) performance in the proposed asymmetric scenario, where the computational capacity of the decoder at the receiver is less than that of the encoder at the transmitter, without increasing the decoding computational complexity. In some implementations is it possible to reach the performance of a full length classical polar code N.

In an implementation of the first aspect, the number of first and second channel likelihoods obtained is M/2 and the polar code has a polar transformation matrix of size M/2. The polar code is classical polar code $T=T_2^{\otimes n}$, denoting the n-fold Kronecker product, where n=log 2(M/2) according to an implementation.

In an implementation of the first aspect, the polar code that is used to decode the first and second sub-input vector has an information set comprising a sub-information set ($I_t$), of an information set (I) of a polar code of length N used to encode an input vector comprising the first and second sub-input vectors. Thus, the reliabilities of a full length polar code N may be taken into account and the performance is increased.

In an implementation, the first aspect further comprises dividing the windowed M signal values into a first sub-channel and second sub-channel of M/2 likelihood values, and using the first and second sub-channel likelihoods to generate the first and second channel likelihoods. For example, the likelihoods may be combined according to a successive correction decoding rule applied according to a factor graph representing a polar code used to generate a codeword transmitted as the received signal values.

In an implementation, obtaining the second channel likelihoods comprises updating a likelihood buffer (L0) of M/2 likelihood values using the decoded first sub-input vector and the first sub-channel likelihood values, and using the buffer together with those of the first and second sub-channel likelihoods at the second window position to generate the second channel likelihoods.

By using a buffer, the dependence of subsequent values on preceding values in the code word (e.g. according to the polar code used to generate the codeword being decoded) may be cumulatively taken into account.

In an implementation of the first aspect, the decoding of the first and second sub-input vector is performed using successive cancellation decoding, and further comprises, obtaining partial sum values based on the decoded sub-input vector u(t), and using the partial sum values to update the likelihood buffer (L0).

In an implementation of the first aspect, using the partial sum values to update the likelihood buffer comprises calculating $L_0=(L_0+L_1)\cdot(1-2x_t)$, where $L_0$ is the likelihood buffer, $L_1$ is the first sub-channel of likelihood values, and $x_t$ is the partial sum values. The size of the buffer being M/2.

According to an implementation of the first aspect, the first and second channel likelihoods are obtained by calculating $$L=(L_0+L_1) \boxplus L_2$$

where L are the likelihoods to be calculated, L0 is the likelihood buffer, L1 is the first sub-channel of likelihood values and L2 is the second sub-channel of likelihood values, and $$A \boxplus B \triangleq \text{sign}(A) \cdot \text{sign}(B) \cdot \min(|A|, |B|).$$

In an implementation of the first aspect, the steps of shifting the window, obtaining second channel likelihoods and decoding the second sub-input vector are performed iteratively. Accordingly, the window can be slid across the received input vector to successively decode the sub-input vectors from the windowed bits. For example, the steps may be iteratively performed until the all received signal values, corresponding to a received codeword, have been decoded into an input vector formed of decoded sub-input vectors.

In a second aspect, there is provided a method of generating a polar code, the method comprising, obtaining a first matrix as an in-fold Kronecker product of a 2×2 binary lower triangular matrix where m=log 2(M/2), M<N, and N is the length of a polar code to be generated, obtaining a second matrix of dimension 2S×2S, where S=N/M and the inverse of the second matrix is a lower triangular band matrix, generating a transformation matrix for the polar code by calculating a Kronecker product of the second matrix with the first matrix, and determining an information set I identifying reliable bit channels for the polar code, whereby a polar codeword of length N may be obtained using the polar code that is decodable by iteratively applying a sliding decoding window of length M to the polar codeword, where M<N.

Accordingly, by appropriate choice of the first and second matrix having the criteria of the second aspect, a polar code of length N may be generated such that the receiver can decode it using a sliding window mechanism, dealing with only M received symbols per decoding operation.

In an implementation of the second aspect, the code is constructed such that a successive decoding process using a polar code of size M/2 may be applied to the windowed M values of the polar codeword during each iteration.

In an implementation of the second aspect, determining the information set comprises:
estimating bit-error probability and/or log-likelihood ratios of first and second kernels having i bit channels, corresponding to the first and second matrices.

For example, in an implementation, the bit-error probabilities of each channel i may be calculated as $$p_i = \begin{cases} 1-(1-\delta)\cdot(1-\delta^i), & i<2S \\ \delta^{2S}, & i=2S \end{cases}$$

where $p_i$ is the bit error probability of the $i_{th}$ bit channel in a kernel, S is the error probability of the input channels, $\delta^i$ is the bit error probability of the $i_{th}$ channel.

In another implementation of the second aspect, the log-likelihood ratios of each channel i are calculated as $$\mu_i = \begin{cases} \phi^{-1}(1-(1-\phi((\mu))\cdot(1-\phi(i\mu))), & i<2S \\ 2S\mu, & i=2S \end{cases}$$

where where μ is the input log-likelihood ratio mean, $μ_i$ is the log-likelihood ratio of the $i_{th}$ channel, and φ is defined as $$\phi(x) = 1 - \frac{1}{\sqrt{4\pi x}} \int_{-\infty}^{+\infty} \tanh\frac{t}{2} e^{-\frac{(t-x)^2}{4x}} dt$$

and can be approximated through curve-fitting. The curve fitting may be performed using methods known to those in the art, for example. as described in J. Ha, J. Kim, and S. W. McLaughlin, "Rate-compatible puncturing of low-density parity-check codes," IEEE Transactions on Information Theory, vol. 50, no. 11, pp. 2824-2836, 2004.

In an implementation, the second aspect further comprises selecting the value M so that M/2 is a length corresponding to the polar codeword decoding capability of a target device. Accordingly, an encoding entity can design the polar codeword so that it can be decoded at a target device having a known computational capability (e.g. length of polar code that it can decode).

In an implementation of the second aspect, the second matrix is a full binary lower triangular matrix of dimension 2S×2S. This permits a relatively simple encoding and decoding process to be performed, for example, in which the encoding (and decoding) can effectively be performed in two stages. For encoding, each M/2 portion of the input vector may be polar encoded into a series of sub-input vectors using the first transformation matrix. Then starting from the last sub-input vector, the sub-input vectors are successively added (e.g. using a bitwise XOR operation) to the preceding sub-input vector.

In a third aspect, there is provided a method of encoding message bits into a polar codeword comprising, inserting K message bits into an input vector u according to the reliable channels identified by the information set I, generating a polar codeword using the input vector u based on a transformation matrix of a polar code according to the second aspect.

In an implementation of the third aspect, generating the polar codeword comprises calculating a product of the input vector and the transformation matrix.

In a fourth aspect, there is provided a method of encoding message bits into a polar codeword using a polar code, comprising: inserting K message bits into an input vector u according to the reliable bit channels identified by an information set I of a polar code of length N; dividing the input vector into 2S sub-input vectors of size M/2, encoding the sub-input vectors using a transformation matrix comprising the m-fold Kronecker product of a 2×2 full binary lower triangular matrix where m=log 2(M/2), iteratively adding the respective bits of an encoded sub-input vector to the immediately preceding encoded sub-input vector.

In a fifth aspect, there is provided apparatus for decoding a received signal comprising means for applying, at a first position, a window of length M to a received signal containing N signal values, where M<N, means for decoding a first sub-input vector using a polar code and first channel likelihoods L based on signal values obtained from the window at the first position, means for shifting the window position to a second position, means for obtaining second channel likelihoods L based on the signal values from the window at the second position and the decoded first sub-input vector, and means for decoding a second sub-input vector using a polar code and the second channel likelihoods.

In an implementation of the fifth aspect, the number of first and second channel likelihoods obtained is M/2 and the polar code has a polar transformation matrix of size M/2.

In an implementation of the fifth aspect, the polar code used to decode the first and second sub-input vector has an information set comprising a sub-information set ($I_t$), of an information set (I) of a polar code of length N used to encode an input vector comprising the first and second sub-input vectors.

In an implementation, the fifth aspect further comprises means for dividing the windowed M signal values into a first channel and second channel of M/2 likelihood values, and the first and second sub-channel likelihoods are used to generate the first and second channel likelihoods.

In an implementation of the fifth aspect, the means for obtaining the second channel likelihoods is configured to update a likelihood buffer (L0) of M/2 likelihood values using the decoded first sub-input vector and the first sub-channel likelihood values, and use the buffer together with those of the first and second sub-channel likelihoods at the second window position to generate the second channel likelihoods.

In an implementation of the fifth aspect, the means for decoding the first and second sub-input vector are configured to use successive cancellation decoding, obtain partial sum values ($x_t = u_t \cdot T_{M/2}$) based on the decoded sub-input vector u(t); and use the partial sum values to update the likelihood buffer (L0).

In an implementation of the fifth aspect, using the partial sum to update the likelihood buffer comprises calculating $L_0 = (L_0 + L_1) \cdot (1 - 2x_t)$, where L0 is the likelihood buffer, L1 is the first sub-channel of likelihood values, and $x_t$ is the partial sum values.

In an implementation of the fifth aspect, the first and second channel likelihoods are obtained by calculating $L = (L_0 + L_1) \boxplus L_2$ where L are the likelihoods to be calculated, L0 is the likelihood buffer, L1 is the first sub-channel of likelihood values and L2 is the second sub-channel of likelihood values, and $$A \boxplus B \triangleq \text{sign}(A) \cdot \text{sign}(B) \cdot \min(|A|, |B|).$$

In an implementation, the fifth aspect further comprises iterating means for iterating the steps performed by the means for shifting the window, the means for obtaining second channel likelihoods and the means for decoding the second sub-input vector are performed iteratively.

In an implementation of the fifth aspect, the iterating means is further configured to cause the steps to be iteratively performed until the received signal values have been decoded into an input vector formed of the sub-input vectors.

In an implementation of the fifth aspect, the apparatus comprises a receiver including a demodulator for demodulating a received signal into the received signal values. The apparatus may be a base station node such as an eNodeB in an LTE communications network, for example, or user equipment (UE), such as a smart phone.

In a sixth aspect, there is provided apparatus for generating a polar code, the apparatus comprising means for obtaining a first matrix as an m-fold Kronecker product of a 2×2 binary lower triangular matrix where m=log 2(M/2), M<N, and N is the length of a polar code to be generated, means for obtaining a second matrix of dimension 2S×2S, where S=N/M and the inverse of the second matrix is a lower triangular band matrix, means for generating a transformation matrix for the polar code by calculating a Kronecker product of the second matrix with the first matrix, and means for determining an information set I identifying reliable bit channels for the polar code, whereby a polar codeword of length N may be obtained using the polar code that is decodable by iteratively applying a sliding decoding window of length M to the polar codeword, where M<N.

In an implementation of the sixth aspect, the code is constructed such that a successive correction (SC) decoding process based on a polar code of size M/2 may be applied to the windowed M values of the polar codeword during each iteration.

In an implementation of the sixth aspect, the means for determining the information set is configured to estimate bit-error probability and/or log-likelihood ratios of first and second kernels having i bit channels, corresponding to the first and second matrices.

In an implementation of the sixth aspect, the bit-error probabilities of each channel i are calculated as $$p_i = \begin{cases} 1-(1-\delta)\cdot(1-\delta^i), & i < 2S \\ \delta^{2S}, & i = 2S \end{cases}$$

where $p_i$ is the bit error probability of the $i_{th}$ bit channel in a kernel, S is the error probability of the input channels, $\delta^i$ is the bit error probability of the $i_{th}$ channel.

In an implementation of the sixth aspect, the log-likelihood ratios of each channel i are calculated as $$\mu_i = \begin{cases} \phi^{-1}(1-(1-\phi(\mu))\cdot(1-\phi(i\mu))) & i < 2S \\ 2S\mu, & i = 2S \end{cases}$$

where where μ is the input log-likelihood ratio mean, $\mu_i$ is the log-likelihood ratio of the $i_{th}$ channel, and $$\phi(x) = 1 - \frac{1}{\sqrt{4\pi x}} \int_{-\infty}^{+\infty} \tanh\frac{t}{2} e^{-\frac{(t-x)^2}{4x}} dt$$

and can be approximated through curve-fitting. The curve fitting may be performed using methods known to those in the art, for example. as described in J. Ha, J. Kim, and S. W. McLaughlin, "Rate-compatible puncturing of low-density parity-check codes," IEEE Transactions on Information Theory, vol. 50, no. 11, pp. 2824-2836, 2004.

In an implementation, the sixth aspect further comprises means for selecting the value M so that M/2 is a length corresponding to the polar codeword decoding capability of a target device.

In an implementation of the sixth aspect, the second matrix is a full binary lower triangular matrix of dimension 2S×2S.

In a seventh aspect, there is provided apparatus for encoding message bits into a polar codeword comprising, means for inserting K message bits into an input vector u according to the reliable channels identified by the information set I, means for generating a polar codeword using the input vector u based on a transformation matrix of a polar code according to the sixth aspect.

In an implementation of the seventh aspect, the means for generating the polar codeword is configured to calculate the product of the input vector and the transformation matrix.

In an eighth aspect, there is provided apparatus for encoding an input vector using a polar code, comprising means for inserting K message bits into an input vector u according to the reliable channels identified by the information set I of a polar code, means for dividing the input vector u into 2S sub-input vectors of size M/2, means for encoding the sub-input vectors using a transformation matrix comprising the m-fold Kronecker product of a 2×2 binary lower triangular matrix where m=log 2(M/2), and means for iteratively adding the respective bits of one or more encoded sub-input vectors to the immediately preceding encoded sub-input vector.

In an implementation of the seventh and eighth aspects, the apparatus comprises a transmitter including means for modulating and transmitting an encoded input vector. The apparatus in an in implementation of any of the sixth to eighth aspects may be base station node such as an eNodeB in an LTE communications network, for example, or a user equipment (UE), such as a smart phone.

In a ninth aspect, there is provided computer program comprising instructions that upon execution by one or more processors, cause the method of any implementation of the first to fourth aspects to be performed. The computer program may be stored on a data carrier or other computer-readable medium, for example. The computer readable carrier medium may be transitory or non-transitory.

In a tenth aspect, there is provided a device comprising one or more processors and a memory configured to perform the method of any implementation of the first to fourth aspects mentioned above. In an implementation of the tenth aspect the device is a base station (e.g. an eNodeB) or user equipment (UE).

BRIEF DESCRIPTION OF THE DRAWINGS

Embodiments will now be described, by way of example only, with reference to the accompanying drawings, in which:

FIG. 7 shows first and second kernel matrices and a transformation matrix of a Polar code according to an embodiment of the disclosure;

DESCRIPTION

Figure 1:
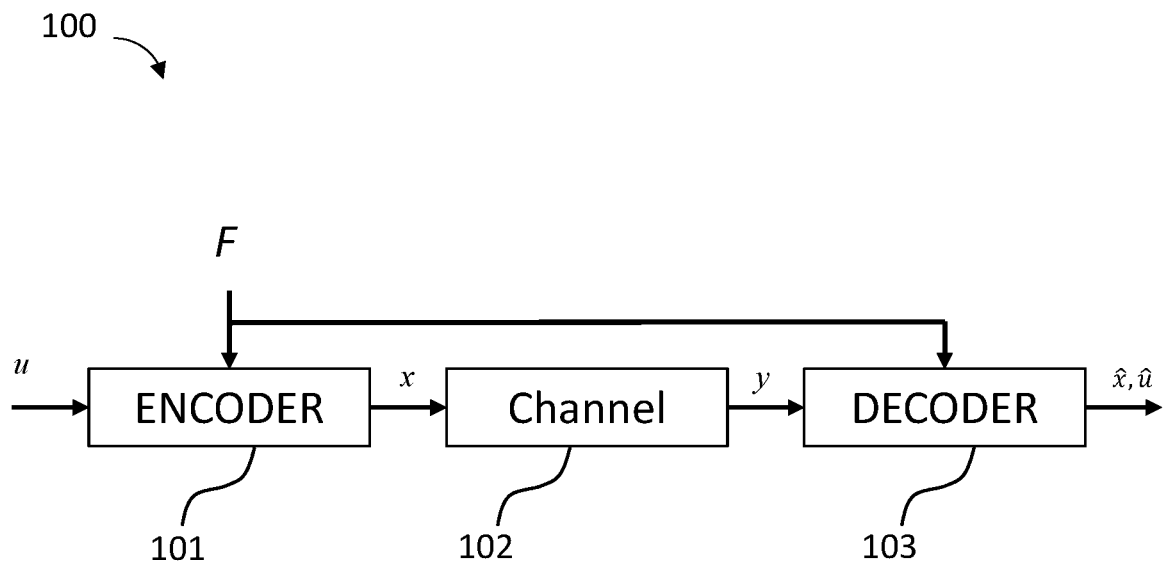
FIG. 1 shows a block diagram of a communications system.

Example embodiments are described below in sufficient detail to enable those of ordinary skill in the art to embody and implement the systems and processes herein described. It is important to understand that embodiments can be provided in many alternate forms and should not be construed as limited to the examples set forth herein.

Accordingly, while embodiments can be modified in various ways and take on various alternative forms, specific embodiments thereof are shown in the drawings and described in detail below as examples. There is no intent to limit to the particular forms disclosed. On the contrary, all modifications, equivalents, and alternatives falling within the scope of the appended claims should be included. Elements of the example embodiments are consistently denoted by the same reference numerals throughout the drawings and detailed description where appropriate.

The terminology used herein to describe embodiments is not intended to limit the scope. The articles "a," "an," and "the" are singular in that they have a single referent, however the use of the singular form in the present document should not preclude the presence of more than one referent. In other words, elements referred to in the singular can number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art. It will be further understood that terms in common usage should also be interpreted as is customary in the relevant art and not in an idealized or overly formal sense unless expressly so defined herein.

FIG. 1 shows a data communication system 100. The data u to be transmitted, termed the information word or input vector, is given to the encoder 101, which produces a codeword x which contains redundancy. This is transmitted over a noisy communication channel 102 which typically introduces errors. The noisy signal is then received by a receiver as an output vector y. The output vector y is provided to the decoder 103 at the receiver side, which uses the received values to calculate estimates of the transmitted codeword x and the transmitted data u. The set C of possible codewords is called the code, or channel code. In this embodiment, a polar code is used at the encoder to encode the input vector u. Both the encoder and decoder know the polar code and thus the positions of the frozen bits or information set are provided at each end. The information set (sometimes called a reliability sequence) is used by the decoder in both determining the decoded the input vector (e.g. during successive decoding) and in extracting the message bits from the input vector.

Figure 2:
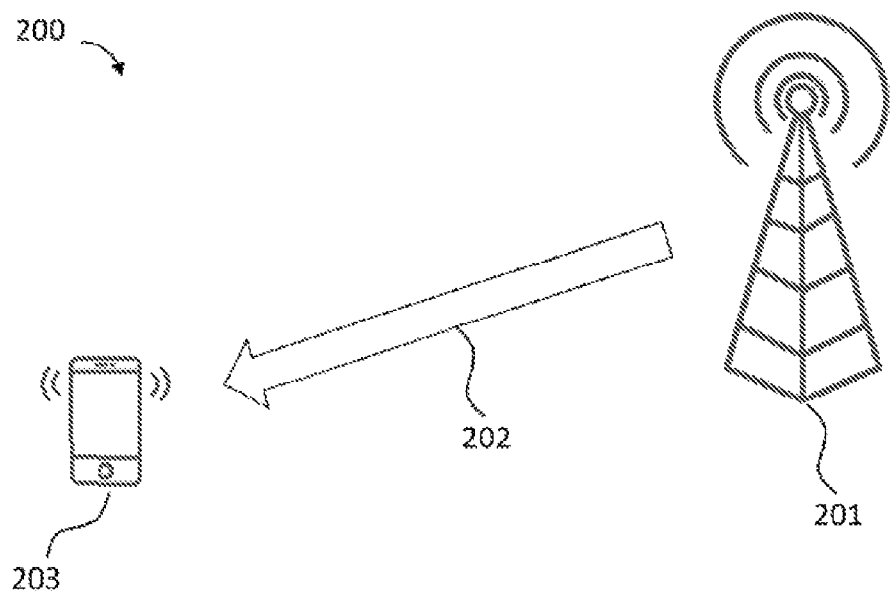
FIG. 2 shows a block diagram of apparatus in a communication system.

FIG. 2 shows a wireless communication system 200 including a base station 201 and user equipment (UE) 203 where the UE may be a portable device such as a smart phone or tablet. The base station 201 includes a transmitter and the UE a receiver, whereby the base station is able to transmit data to the UE 203, for example, in a downlink or uplink connection 202 made according to a telecommunications protocol. Embodiments of the disclosure may be applied in various communications systems. For example, it could be applied to any of a Global System for Mobile Communications (GSM), code division multiple access (CDMA), wideband code division multiple access (WCDMA), general packet radio service (GPRS), long term evolution (LTE), LTE frequency division duplex (FDD), LTE Time Division Duplex (TDD), a universal mobile telecommunications system (UMTS), enhanced mobile broadband (eMBB), ultra-reliable low-latency communications (URLLC) and massive machine-type communications (mMTC), or any $5^{th}$ generation (5G) wireless communication system. For example, information or data in any of these systems encoded using a traditional error correcting code such as a Turbo code or an LDPC code on the base station 201 or UE 203 may be encoded instead using a code generated according to the following embodiments.

We consider communication between a transmitter and a receiver having different computational capabilities, namely when the receiver is less powerful than the transmitter, e.g. the downlink in the wireless communication system 200. In the following embodiments, the transmitter is able to encode message data to create polar codewords of length N, while the receiver can process and decode only polar codewords of length M<N.

Code Design

According to an embodiment, we describe how to design a polar code of length N and dimension K such that it is decodable through a sliding window of size M. To design a polar code means to provide a transformation matrix T and a frozen set F (or conversely the information set K).

Figure 3:
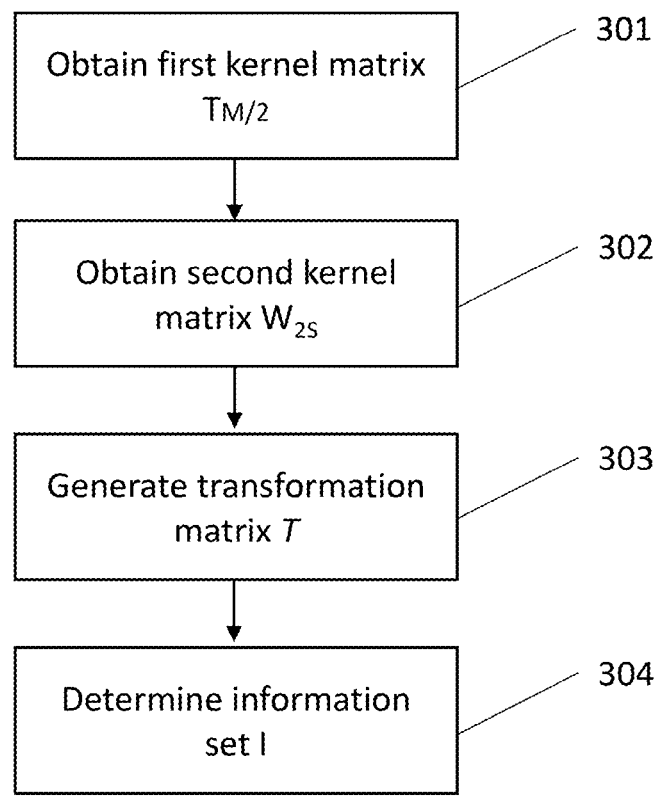
FIG. 3 shows a flow chart for a method of generating a Polar code according to an embodiment of the disclosure.

The process of generating a polar code according to an embodiment will be described with reference to the flow chart of FIG. 3.

The transformation matrix T may be designed as follows. In a first step 301, we obtain a first kernel matrix $T_{M/2}$. Given S=N/M, where N is the length of the polar codeword to be generated at the encoder and M is the length of codeword that can be processed at a target decoder, $T_{M/2}=T_2^{\otimes m}$ with $m=\log_2(M/2)$ and the fundamental $T_2$ polar code matrix is given by $$T_2 = \begin{pmatrix} 1 & 0 \\ 1 & 1 \end{pmatrix}.$$

Thus, $T_{M/2}$ is the transformation matrix of a classical polar code of length M/2.

The next stage 302 is to obtain a second kernel matrix $W_{2S}$. The kernel $W_{2S}$ is a kernel defined by a full binary lower triangular matrix of size 2S×2S. The value of S being as given before, S=N/M. The $W_{2S}$ kernel matrix is illustrated for an arbitrary value of 2S in FIG. 4. The matrix can be redrawn as a factor graph comprising 2S input bit channels 501 and 2S output bit channels 502. The rows in the graph are interconnected by a series of summation nodes which perform an XOR operation on bitwise inputs. The output of each summation node is fed into the input of the summation node in the row above. In this way the input values are iteratively reverse summed starting from the last bit value in the input bit channels 501.

Figure 4:
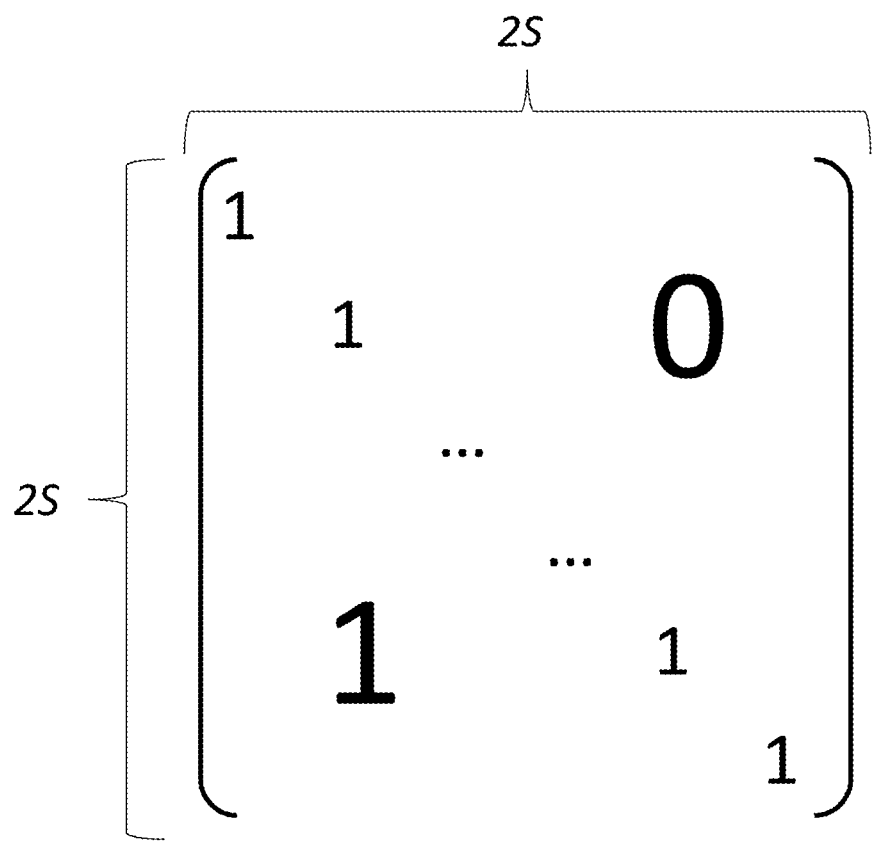
FIG. 4 shows kernel matrix for generating a Polar code used in an embodiment of the disclosure.
Figure 5:
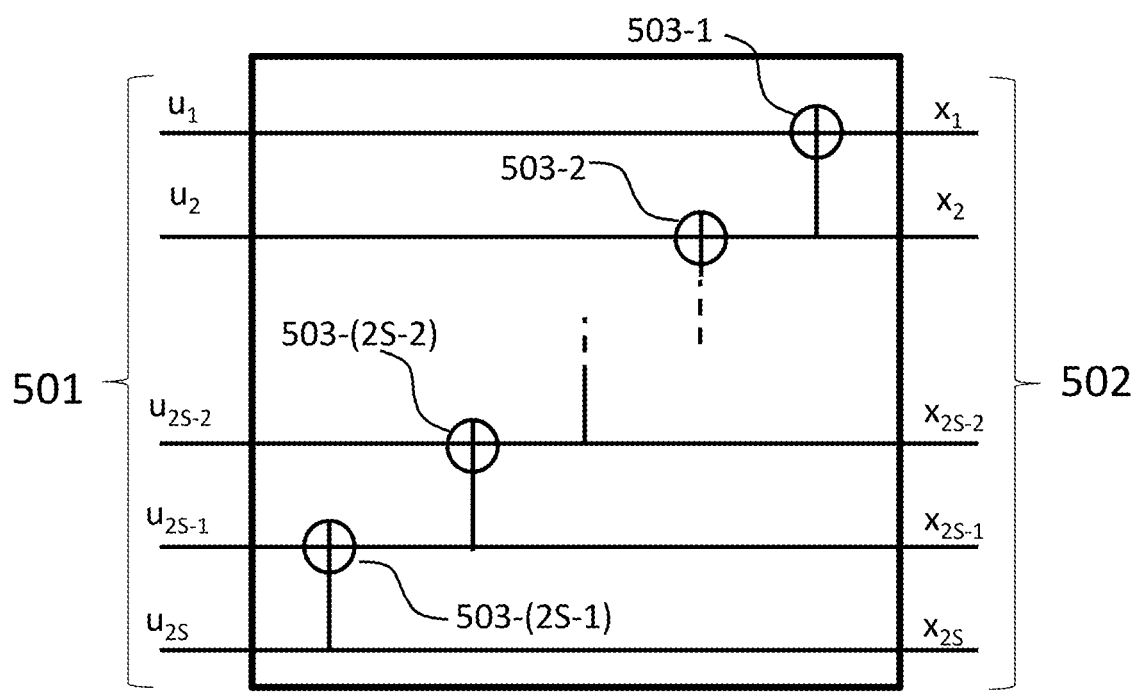
FIG. 5 shows a Tanner graph representing the matrix shown in FIG. 3 for use in an embodiment of the disclosure.
Figure 6:
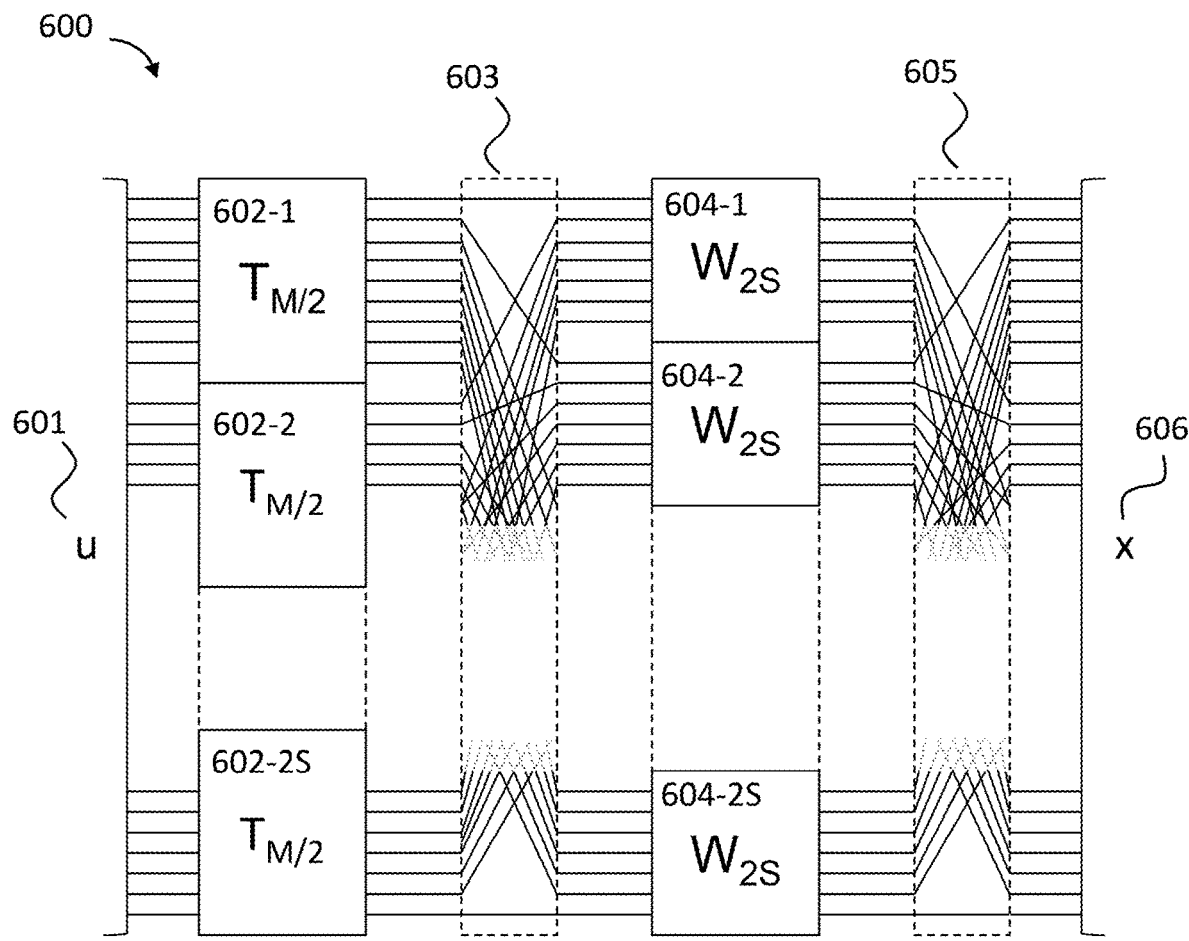
FIG. 6 shows a Tanner graph of a transformation matrix of a Polar code according to an embodiment of the disclosure.

The transformation matrix is then determined according to the definition $T=W_{2S}\otimes T_{M/2}$. In other words, the transfer matrix is defined as the Kronecker (tensor) product of the $W_{2S}$ kernel obtained in 302 with the classic transformation matrix of a polar code of length M/2 This matrix his given by a square matrix of size 2S×2S having ones on and below the diagonal, and zeros above the diagonal as depicted in FIG. 4. Moreover, its factor graph representation is depicted in FIG. 5. The Tanner graph of the resulting transformation matrix T can be described as a multi-kernel polar code and is depicted in FIG. 6 for the general case of an input vector u of size N. The number of connections shown in FIG. 6 illustrative and the actual number will depend on the kernel sizes for $W_{2S}$ and $T_{M/2}$.

The Tanner graph 600 comprises a series of input channels or rows over which the values of an input vector 601 are received. In a first stage of the graph there are a series of $T_{M/2}$ encoding units 602-1 to 602-2S to which the input rows receiving the values of an input vector u are sequentially connected. The input vector can be considered as a series of sub-input vectors $u_1$ to $u_{2S}$ each received at the inputs of a corresponding $T_{M/2}$ encoding unit which is encodes the M/2 inputs according to a classical polar code kernel i.e. for a sub-input vector $u_n$ the encoded bits are equal to $u_n \cdot T_{M/2}$. These output bits are then spread evenly across the $W_{2S}$ coding units 604-1 to 604-2S, according to permutation network 602 such that each output is received at a corresponding one of the inputs of respective $W_{2S}$ coding units 604-1 to 604-2S in a second coding stage. Accordingly, the outputs of the first $T_{M/2}$ encoding unit are received by the first inputs of each $W_{2S}$ coding unit respectively, the outputs of the second $T_{M/2}$ unit are received at the second inputs of each $W_{2S}$ coding unit respectively, and so on. The outputs of the $W_{2S}$ coding units are then reordered according to the permutation connections (reordering network) 605 to output an encoded codeword x. The permutations (reordering) being such that a partial vector consisting of the first M/2 values of the codeword x correspond to the first outputs from the four $W_{2S}$ coding units 604-1 to 604-2S respectively, a second partial vector consisting of the next M/2 values of x correspond to the second outputs from the four $W_{2S}$ coding units 604-1 to 604-2S, and so on.

In the above embodiment, the selection of the second kernel matrix is a full binary lower triangular matrix of size 2S×2S. However, other choices are possible for the second kernel matrix. In particular, the key property that enables the received codeword x to be sequentially decoded in portions with the decoding result of each portion being fed back into the decoding of the next portion, (i.e. by applying a sliding window) is that the inverse $W^{-1}$ of the second kernel matrix W consists of a lower triangular band matrix. As will be illustrated by way of a later embodiment, it is this property that allows each set of M values received to be iteratively decoded in t-uples of vectors of M/2 values according to existing successive decoding update rules. The absence of '1's in each column of $W^{-1}$ below a certain point ensures that only a subset of the N received LLRs need to be used for the decoding of a particular input bit $u_i$.

A frozen set can be designed according to multi-kernel polar code mechanism. Reliabilities are determined for each output of the kernel matrix $W_{2S}$ and then propagated from right-to-left along the Tanner graph to the $T_{M/2}$ kernel matrices and determine the reliability at each input bit channel. The most reliable channels are determined from the resulting values and the frozen channel positions determined as the remaining unreliable channels.

Accordingly, we need to determine the polarization equations of the kernels $W_{2S}$ and $T_{M/2}$. Under BEC, bit error probability can be calculated, while under AWGN channel, DE/GA method can be used [5]. This algorithm estimates the log-likelihood ratios (LLRs) distribution of the polarized channels by tracking their mean at each stage of the SC decoding tree. Given the block decoder representation of kernel $W_{2S}$ depicted in FIG. 7, the bit error probability of bit $u_i$ of the kernel can be calculated as $$p_i = \begin{cases} 1-(1-\delta)\cdot(1-\delta^i), & i<2S \\ \delta^{2S}, & i=2S \end{cases} \quad (1)$$

where δ is the error probability of the input channels, while the LLR mean $\mu_i$ for a bit channel $u_i$ can be calculated as $$\mu_i = \begin{cases} \phi^{-1}(1-(1-\phi(\mu))\cdot(1-\phi(i\mu))), & i<2S \\ 2S\mu, & i=2S \end{cases} \quad (2)$$

where μ is the input LLR mean and function ϕ can be defined as $$\phi(x) = 1 - \frac{1}{\sqrt{4\pi x}}\int_{-\infty}^{+\infty} \tanh\frac{t}{2}e^{-\frac{(t-x)^2}{4x}}dt$$

and can be approximated through curve-fitting. The curve fitting may be performed using methods known to those in the art, for example. as described in J. Ha, J. Kim, and S. W.

McLaughlin, "Rate-compatible puncturing of low-density parity-check codes," IEEE Transactions on Information Theory, vol. 50, no. 11, pp. 2824-2836, 2004.

Using the above metrics, the reliability of each bit of the input vector can be calculated; the K best bits will form the information set I, while the indices of the remaining N–K bit-channels form the frozen set F of the code.

The bit error probabilities log-likelihood ratio means of the classical polar code kernel can be determined in an existing manner that would be known to those skilled in the art.

With equations for both the $T_{M/2}$ and $W_{2S}$ matrices, given a known error probability or LLR mean at the output we can work back to determine a value that is a measure of the reliability of each bit channel in the transformation matrix.

Encoding

The K message bits are inserted in the input vector u according to the information I set previously calculated, namely storing their values in the indices listed in I, while the remaining bits of u are set to zero. Codeword x is then calculated as x=u·T, where T is the transformation matrix of the code calculated as previously described. Codeword x is then transmitted through the channel as shown in FIG. 1.

Alternatively, codeword x can be calculated only on the basis of the transformation matrix $T_{M/2}$ of a polar code, e.g. without the need of implementing matrix $W_{2S}$. In fact, given the sub-information set $I_t$ for t=1, . . . , 2S, calculated from the information set I as the set of entries of I comprised between $$(t-1) \cdot \frac{M}{2} + 1$$

and t·M/2 reduced by (t−1)·M/2, input vectors $u_1, \ldots, u_{2S}$ are created accordingly on the basis of the message bits. Each partial input vector is encoded independently through matrix multiplication by $T_{M/2}$, obtaining partial codewords $x_1, \ldots, x_{2S}$. Finally, codeword x is obtained by backward accumulating the partial codewords starting from the last one, i.e. $x=[x_1 \oplus \ldots \oplus x_{2S}, x_2 \oplus \ldots \oplus x_{2S}, \ldots, x_{2S-1} \oplus x_{2S}, x_{2S}]$. where $\oplus$ applies a bitwise XOR operation when applied to binary partial codewords.

Example of a Polar Code

As an example, we will now describe the generation of a polar code according to the above embodiment when the N=16, M=8 and, thus, S=N/M=2.

Given M/2=4, then the first kernel matrix 701 is selected as classical polar transformation matrix of dimension M/2, i.e. $T_4$ as shown in FIG. 7. The second kernel matrix 702 is of dimensions 2S×2S=4×4 and the 4×4 full binary lower triangular matrix $W_4$ is used. The transform matrix T of the generated polar code is then given by the Kronecker product of $W_4$ with $T_4$, giving transformation matrix 703, as shown.

Figure 8B:
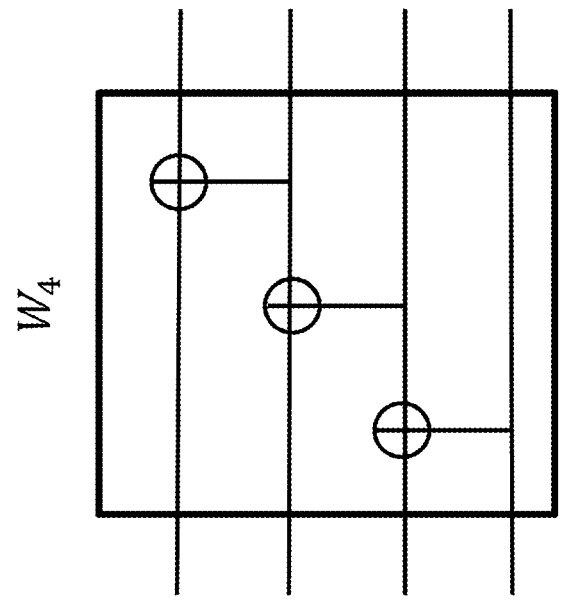
FIGS. 8a and 8b show Tanner graphs of the first and second kernel matrices of FIG. 7 according to an embodiment of the disclosure.
Figure 8A:
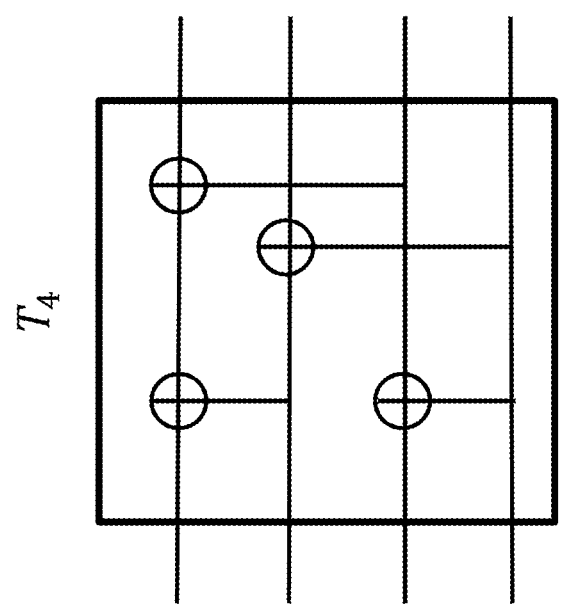
Figure 9:
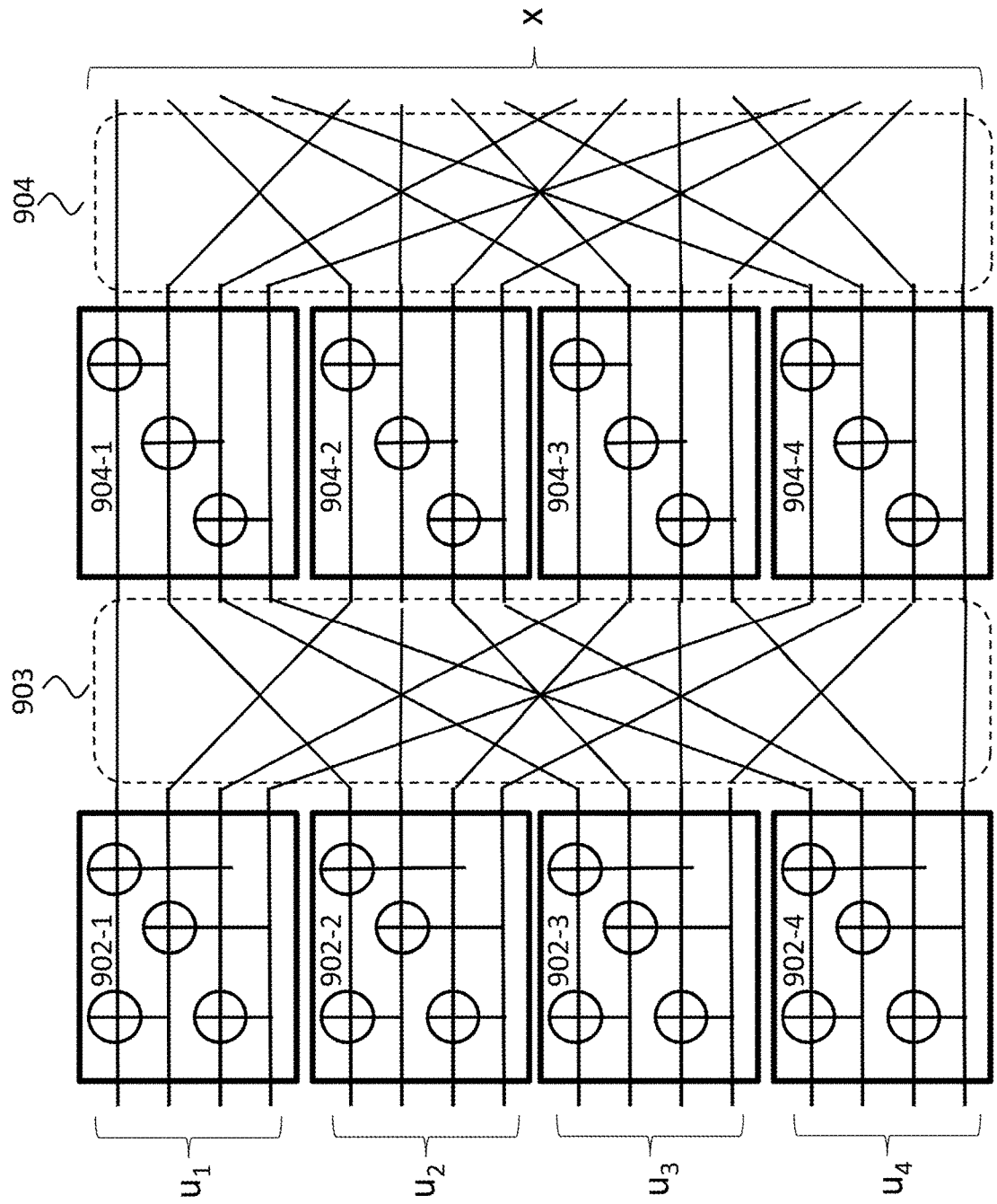
FIG. 9 shows a Tanner graph for the transformation matrix of the Polar code of FIG. 7 in an embodiment of the disclosure.

The Tanner graph of the matrix 703 may be constructed using the coding blocks for T4 and $W_4$ shown in FIGS. 8a and 8b respectively. The full Tanner graph is then as shown in FIG. 9, consisting of four $T_4$ units 902-1 to 902-4 and four $W_4$ units 904-1 to 904-4 connected by reordering (permutation) network (connections) 903 and having outputs reordered according to reordering (permutation) network (connections) 904. The input vector may be considered as a sequence of sub-input (partial) vectors $u_1$ to $u_4$ each having M/2=4 bits and the output vector x is provided after the reordering network 903. The encoded bits of the output vector x would then be propagated through a communications channel and received at a received as a vector y or received values (e.g. LLRs).

Figure 10:
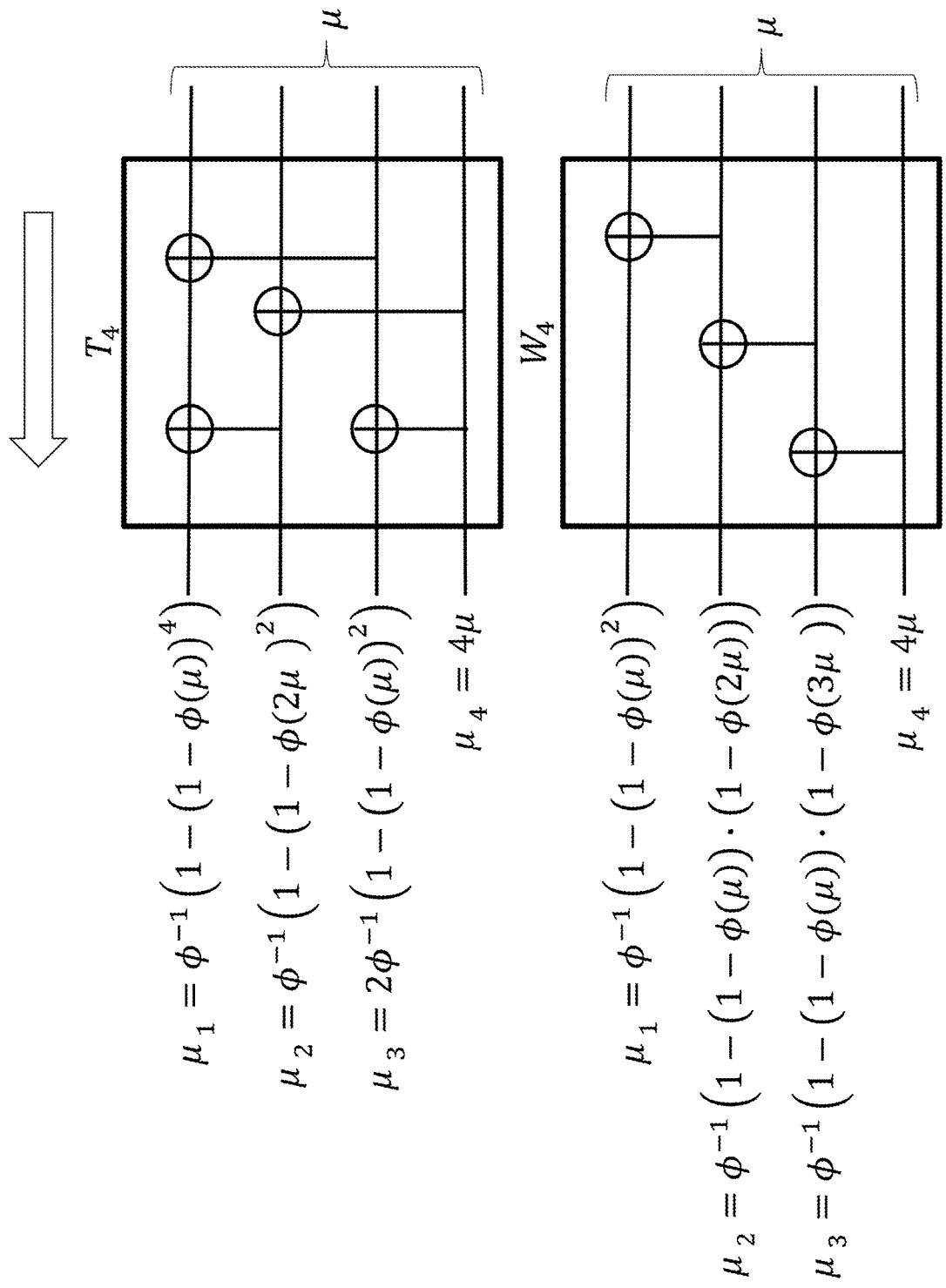
FIG. 10 illustrates expressions for LLR means corresponding to bit channels in the Tanner graphs of FIGS. 8a and 8b according to an embodiment of the disclosure.

In this embodiment, LLR mean values are calculated as the basis for determining the reliability of each bit channel to which the bits of the input vector are applied. Thus, for the $W_4$ block equation (2) may be applied giving the expressions for $\mu_1, \mu_2, \mu_3, \mu_4$ as shown in FIG. 10. The corresponding expressions for the $T_4$ block are also shown and these are determined according to existing techniques known to those skilled in the art.

Figure 11:
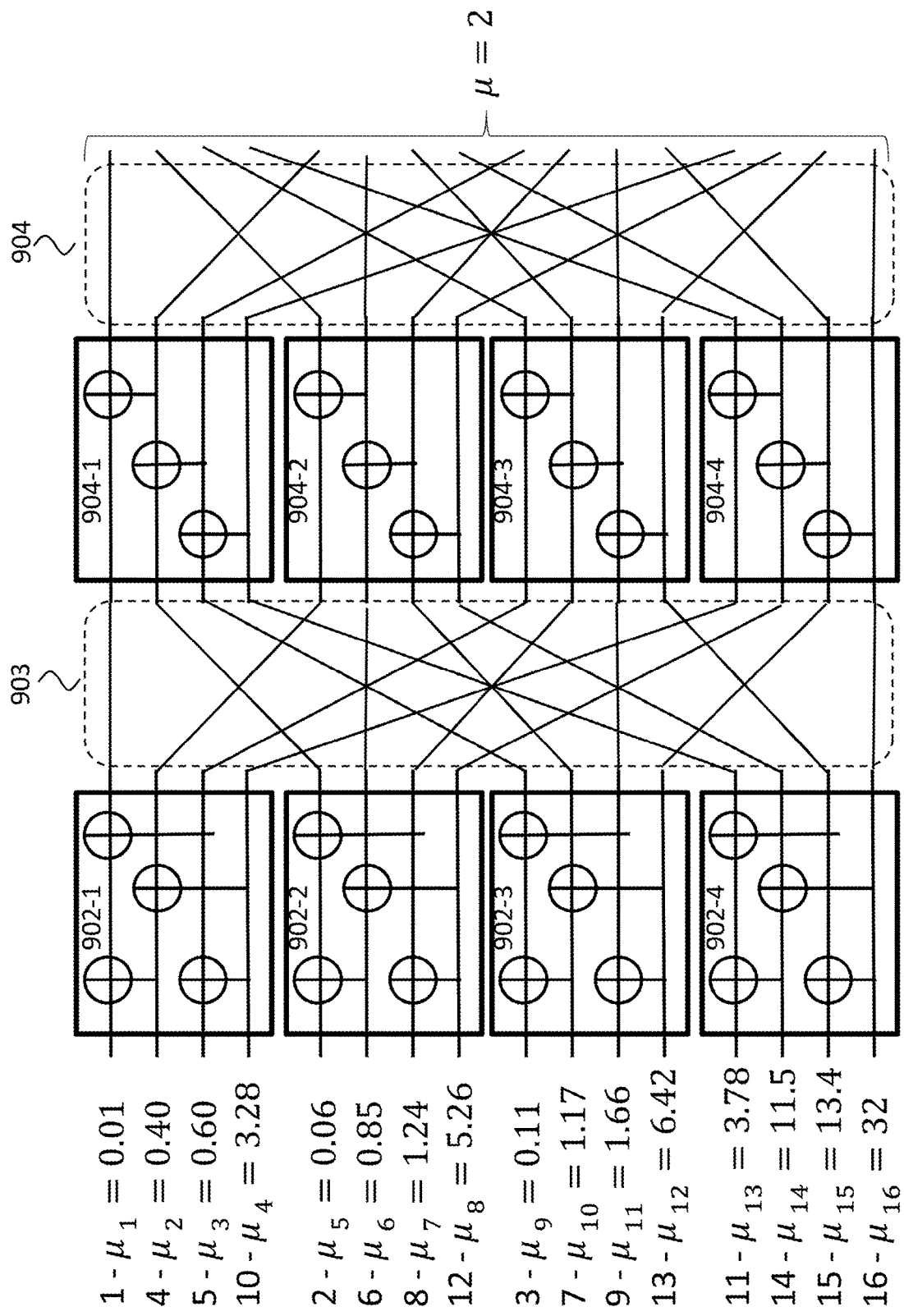
FIG. 11 shows values of bit channel LLR mean values and their respective ranking for a case where the input LLR mean is 2, according to an embodiment of the disclosure.

If we start at the right hand side of the Tanner graph and take the input mean LLR value to be μ=2 then the resulting output mean LLRs for each bit channel i=1 . . . 16 are given as $\mu_i$={0.01, 0.40, 0.60, 3.28, 0.06, 0.85, 1.24, 5.26, 0.11, 1.17, 1.66, 6.42, 3.78, 11.5, 13.4, 32}. Low values correspond to unreliable channels and the order of the bit channels in terms of reliability is shown as the column 1100 in FIG. 11. Taking K=8 information channels from the N bit channels upon which message bits can be transmitted, the information set is I={4, 8, 11, 12, 13, 14, 15, 16}. Conversely, the frozen set contains N-K channels and comprises F={1, 2, 3, 5, 6, 7, 9, 10}. Each of the bit channels in the frozen set is set to zero in the input vector and the message bits are placed in the positions indicated by the information set. Either the frozen set F or the information set I may be provided as a component of the polar code together with the transformation matrix as one is the converse of the other.

This can be illustrated by the following encoding example which uses the polar code of FIGS. 7 to 10 already described above. Consider a message m=[1 1 1 0 0 0 0 1] that we wish to encode and transmit. If we use the frozen set F={1, 2, 3, 5, 6, 7, 9, 10} then the resulting input vector u=[0 0 0 1 0 0 0 1 0 0 1 0 0 0 0 1], where the values shown in underline are the frozen bits set to 0 and the message bits m are inserted across the remaining positions. The encoded message x can then be calculated according to the transformation matrix T of FIG. 7 as:

$$x = u \cdot T = [0\ 1\ 0\ 1\ 1\ 0\ 1\ 0\ 0\ 1\ 0\ 1\ 1\ 1\ 1\ 1]$$

Alternatively, the alternate encoding method already described above can be used that doesn't explicitly require generating the transformation matrix T. According to this process the input vector u=[0 0 0 1 0 0 0 1 0 0 1 0 0 0 0 1]. The input vector may be divided into sub-input vectors u1 to u4 of length M/2=4 such that, $u_1$=[0 0 0 1], $u_2$=[0 0 0 1], $u_3$=[0 0 1 0], $u_4$=[0 0 0 1]. Equivalently, a sub-information set I1 to I4 may be obtained from the information set I for the full polar code such that $I_1$={4}, $I_2$={4}, $I_3$={3,4}, $I_4$={1,2,3,4} and the four sub-input vectors $u_1$ to $u_4$ populated accordingly. Each of the sub-input vectors $u_1$ to $u_4$ may then be encoded using the $T_4$ classical polar transformation matrix. The resulting encoded vectors are $x_1$=[1 1 1 1], $x_2$=[1 1 1 1], $x_3$=[1 0 1 0], $x_4$=[1 1 1 1]. In order to generate the slidably decodable codeword, the following operation is performed:

$$x = [x_1 \oplus x_2 \oplus x_3 \oplus x_4, x_2 \oplus x_3 \oplus x_4, x_3 \oplus x_4, x_4]$$

where $\oplus$ denotes a bitwise XOR operation applied to binary partial codewords $x_1$ to $x_4$.

Figure 12:
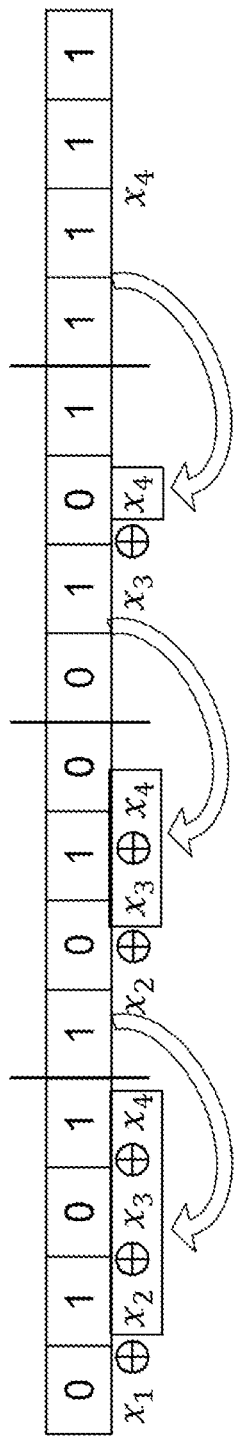
FIG. 12 shows a method of encoding a message using a Polar code according to an embodiment of the disclosure.

This is further illustrated in FIG. 12, and can intuitively be seen to be replicating the process denoted by the units 903, 904-1 to 904-4, and 904 of the Tanner graph of FIG. 9 but without explicit reference to the W4 transformation matrix. In particular, the reverse summation can be seen to correspond to the XOR operations carried out in the $W_4$ blocks 904-1 to 904-4 on the output values provided by the $T_4$ blocks 902-1 to 902-4. As will become clear from the subsequent decoding embodiment, it is this iterative summation process which is inversed by application of a sliding window to received signal values of a codeword x encoded according to the above described embodiments.

Sliding Window Decoding

Figure 13:
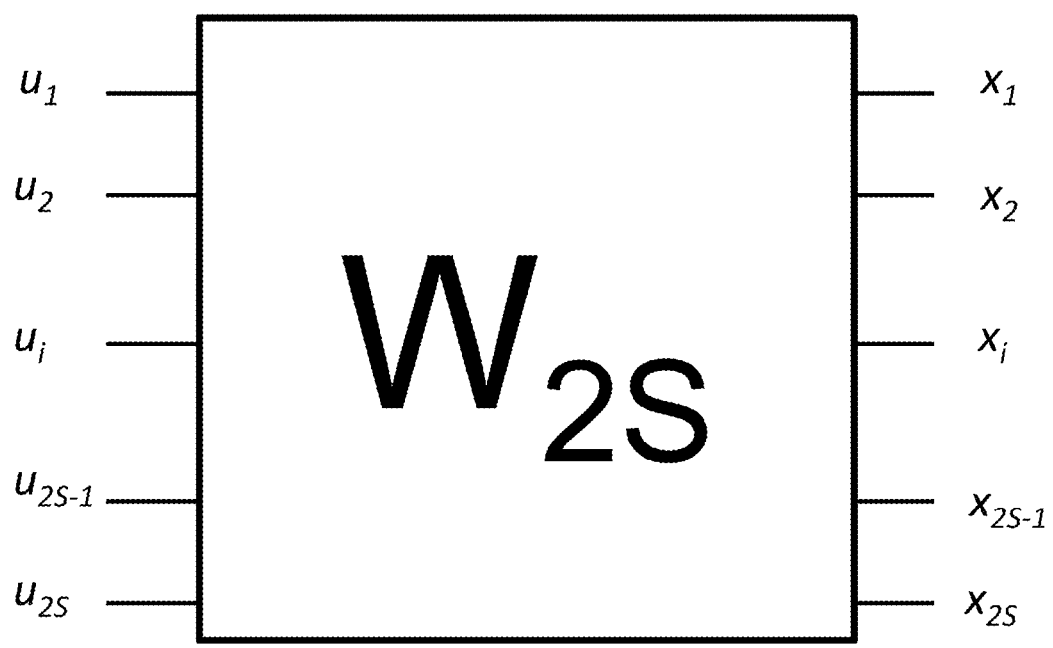
FIG. 13 shows a decoding box for a kernel matrix used according to embodiments of the disclosure.

Sliding window decoding of a polar codeword generated using a polar code designed according to the above embodiment is performed such that 2S polar decoding steps are used, each one using M channel signals (e.g. received signal values upon which LLRs are based). Each step outputs M/2 bits of the input vector, using the M/2 input bits decoded at the previous step to steer half of the LLRs used in the decoding. We consider can consider the W2S block, as shown in FIG. 13 as a decoding box having $u_{1 \ldots 2S}$ input channels and $x_{1 \ldots 2S}$ decoded output values.

Figure 14:
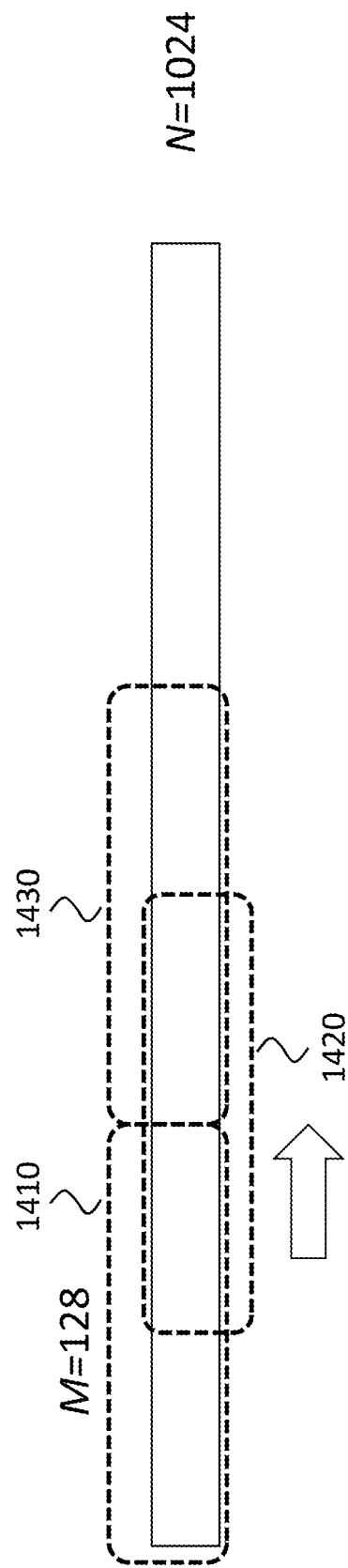
FIG. 14 illustrates a sliding window decoding process according to an embodiment of the present disclosure.
Figure 15:
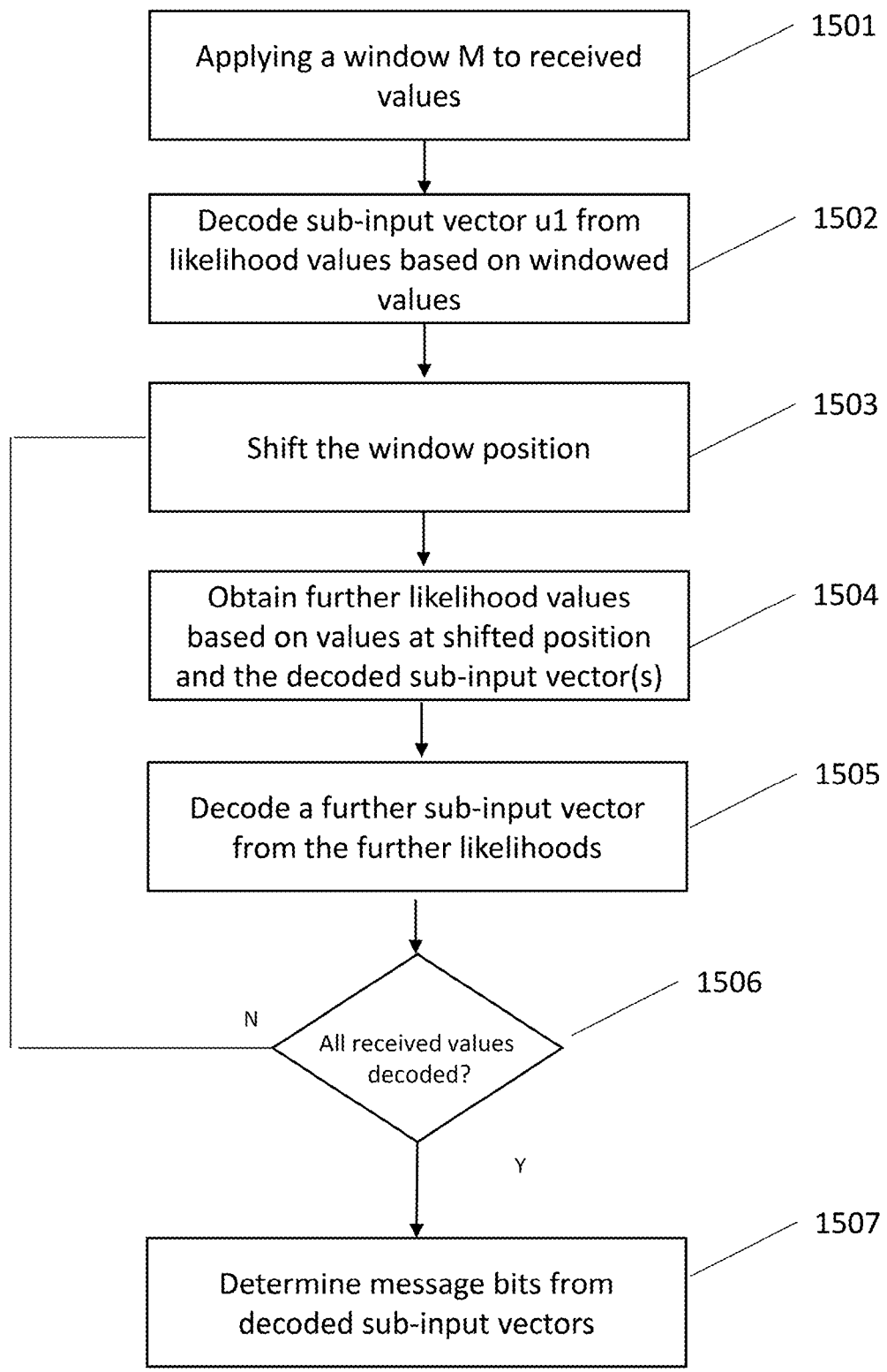
FIG. 15 shows a flow chart of a decoding method according to an embodiment of the present disclosure.

In general, the decoding proceeds as shown in FIG. 14 and according to the flow chart of FIG. 15. In a first step 1501, a window 1410 is applied to a received sequence of signal values corresponding to likelihoods of the coded bits x received at decoder. In the example shown in FIG. 14, the received signal has N=1024 values and the window size M=128.

Then at a second step 1502 a sub-input vector is calculated from the windowed values. Where the sub-input vector $u_t$, where t is the number of the decoding step, is comprised of M/2 bits and is calculated from M/2 likelihood values (LLRs) which are derived from the windowed values. As will be seen these are derived by combining the values according to the Tanner graph representation of the Polar code as previously shown in FIGS. 6 and 9, for example.

Once the sub-input vector $u_1$ is calculated at the first window position, at 1503 the window is shifted to a further (e.g. second position) 1420. In particular, the window is shifted to the right from an initial position by M/2 values. Further likelihood values are determined at 1504 corresponding to the second position in a similar manner as the first but also taking into account the LLR values now having been discarded in moving the window position. A further sub-input vector $u_2$ is then decoded based on the derived likelihoods (Step 1505).

At 1506, a determination is made as whether all the received signal values have been decoded. In other words, have all the sub-input vectors that make up the input vector been decoded from the received signal values. If the answer is 'No' then the process returns to step 1503 and the window is shifted by M/2 values to a further position 1430 and the decoding process continues. At 1504, in obtaining the further likelihood values not only are the likelihoods discarded from the immediately preceding window taken into account but also all preceding but now discarded values. This may be achieved by maintaining a buffer that is updated at the end of each decoding stage by performing a process using the values that are to imminently be discarded. A specific embodiment describing this process will be described subsequently.

If the answer is "yes" at step 1506 then the process moves to step 1507 in which message/information bits are determined from the sub-input vectors which when concatenated together comprise the full input vector into which the information bits to be decoded have been inserted. The information bits can be extracted using the information set (i.e. reliability sequence) which specifies the bit positions containing information (good channels) and those containing frozen bit values (noisy/bad channels). The information set is the full-length information set corresponding to the polar code generated above having the length N.

Figure 16:
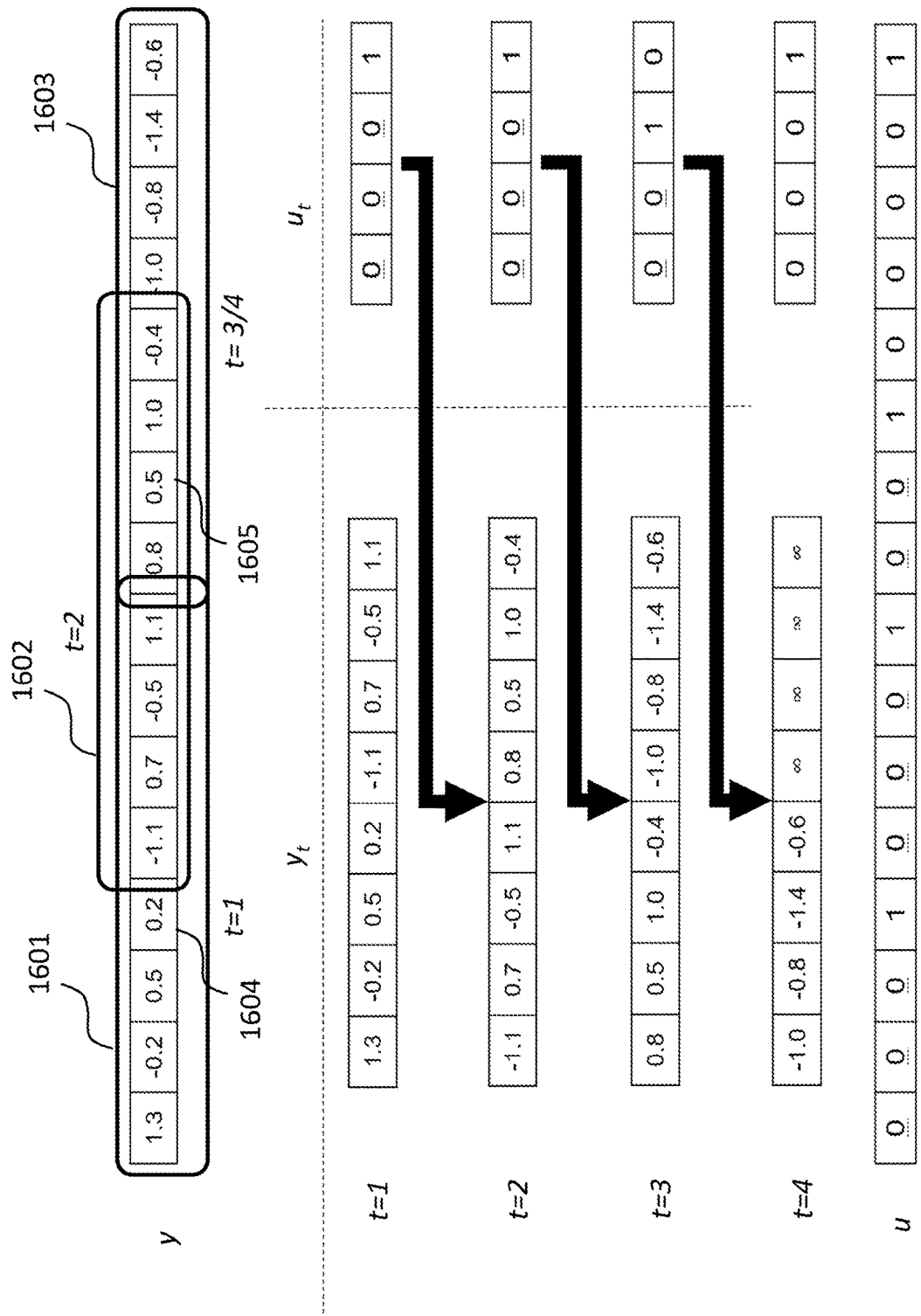
FIG. 16 is a block diagram schematically illustrating a sliding window decoding process in an embodiment of the present disclosure.
Figure 17:
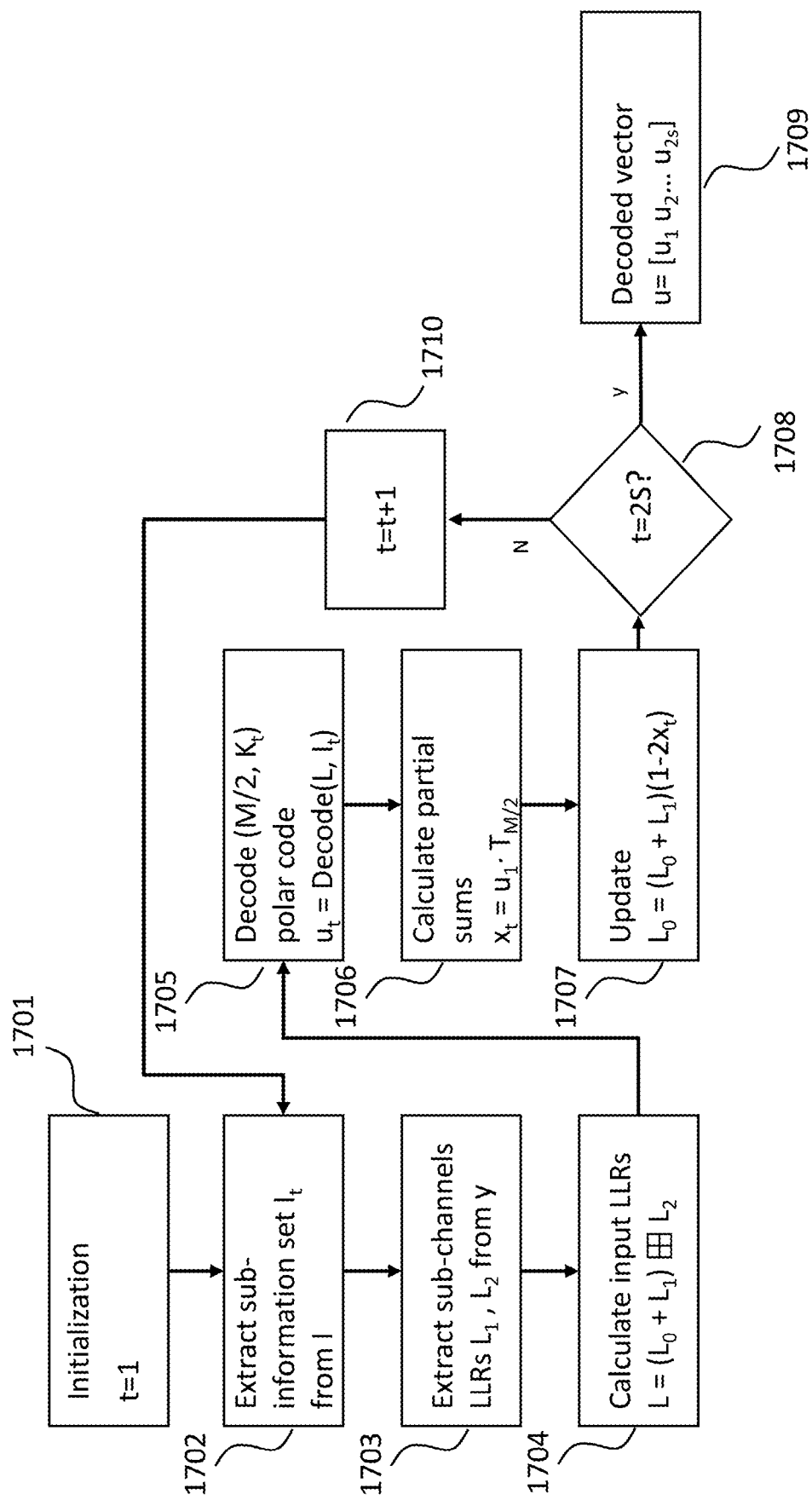
FIG. 17 shows a flow chart of a decoding method according to an embodiment of the present disclosure.

A decoding example is depicted in FIG. 16 whereby the window position is changed at each stage t of a decoding process. A received signal y comprises multiple LLR values. The LLR values are based on signals received when the codeword correspond to the previous encoding example where N=16 and M=8 traverses a communications channel. In this example, two LLR values 1604, 1605 have a sign error. A first window position 1601 is denoted by t=1 and a shifted window position 1602 by t=2, for example. The window is shifted again to a further position 1603 at t=3 but remains at the same position for t=4. The window is shifted at each stage by M/2=4 values in this example. The resulting sub-input vector $u_t$ decoded at each stage t is fed forward to the next decoding stage and used together with the LLR values from y at the shifted position to decode the next sub-input vector. The frozen bits indicated by underline, are set according to respective a sub-information set $I_t$ determined from the information set I of the full length polar code. As only the last M/2 values are used in the final decoding step, the window at t=4 can be considered the same as at t=3. Another way to view this, would be that the window is shifted at t=4 but the window extends beyond the codeword and those values are not used and are set to infinity. The output sub-input vectors $u_1$, $u_2$, $u_3$, $u_4$ are concatenated to determine the full input vector u.

In embodiments, the received signal values y are log likelihood ratios (LLRs) and the decoding process based on a successive cancellation (SC) decoding scheme. However, it is noted that other existing polar decoding schemes (e.g. successive cancellation list (SCL) decoding) may alternatively be used to iteratively determine the values of the input vector by evaluating and updating received values as they propagate through the Tanner graph, making hard decisions on the input bits based on the propagated received values and knowledge of the positions of the frozen bits according to the polar code. Further, although log-likelihood ratio (LLR) values are used here, another measure of likelihoods based on received signal values (e.g. from a demodulated signal) may be used. LLR values are convenient computationally because they avoid computational under-flow occurring when the algorithm is implemented by a processor.

In general, the log-likelihood ratios (LLRs) are propagated along the Tanner graph from right-to-left and hard decisions on the decoded bits of the input vector u are passed from left-to-right and used to update the LLR values in subsequent branches for consistency with the decoded bits. Initially, the LLRs of the coded bits x based on the received vector y are calculated at the receiver. The received signal is decoded bit-by-bit using LLR propagation through the graph to retrieve the transmitted input vector u (i.e. the transmitted message). For every bit $u_i$, the position i is checked against the information set which indicates the bit positions of the input vector that contain frozen bits and those that contain information bits. If the position i of the bit $u_i$ corresponds to a frozen bit then its value is decoded as the predetermined value $u_i$=0, and the decoder moves on to evaluating the next bit. If the information set indicates that $u_i$ is an information bit, then a corresponding LLR is recursively calculated for that bit position. A decision is then taken based on the calculate LLR as to the value of the bit $u_i$ at that position. This is typically done according to a threshold, where negative LLR values are indicative of '1' and positive values indicative of a '0'. The determination of the LLR for the bit $u_i$ generally involves receiving LLR values from a preceding stage in the multi-kernel tanner graph and updating the values according to the update rules for that kernel block. Each kernel block consists of recursively connected iterations of the fundamental $T_2$ polar code block and uses existing decoding rules for the existing polar codes kernel. Such that where $(u_0 u_1) \cdot T_2 = (x_0 x_1)$, with $$T_2 = \begin{pmatrix} 1 & 0 \\ 1 & 1 \end{pmatrix},$$

and where $\lambda_i$ and $l_i$ denote LLRs at the input vector side and output side (i.e. received LLR values) respectively, and $u_i$ and $x_i$ denote the hard decision on the bit values being decoded. The hard decision update rules dictate that $$x_0 = u_0 + u_1 \qquad\qquad -3$$

$$x_1 = u_1 \qquad\qquad -4$$

Further, the inverse update rules (i.e. going from right-to-left in the Tanner graph) are $u_0 = x_0 + x_1$ and $u_1 = x_1 = u_0 + x_0$ which corresponding to the message update equations:

$$\lambda_0 = l_0 \boxplus l_1 \qquad\qquad -5$$

$$\lambda_1 = l_0 + l_1 \cdot (1 - 2u_0) \qquad\qquad -6$$

and $$A \boxplus B \stackrel{\Delta}{=} 2\tanh^{-1}\left(\tanh\frac{A}{2} \cdot \tanh\frac{B}{2}\right) \cong \operatorname{sign}(A) \cdot \operatorname{sign}(B) \cdot \min(|A|, |B|)$$

A further embodiment of the decoding process is provided in FIG. 16. Let us suppose that the N channel LLRs are stored in the vector y consisting of received values of codeword transmitted over a noisy channel. The decoder performs $t=1 \ldots 2S$ polar decoding steps of $(M/2, K_t)$ polar codes, where $K_t$ is the number of information bits in a sub-information set $I_t$ for the classical polar code with transformation matrix $T_{M/2}$. The value t indicates a decoding window position for M signal values which are derived as set out below.

In an initialization step 1701, upper LLRs $L_0$(LLR buffer) are initialized to zero. We call these upper LLRs because they relate to the LLRs that propagates downwards from an upper branch in the Tanner graph derived in a previous decoding window t. The input vector y is initialized with LLR values corresponding to values of a signal received at the decoder. An information set I is initialized with the reliability sequence of the full multi-kernel polar code by which the received signal was encoded. The step counter t is initialized to $t=1$.

At step 1702, sub-information set $I_t$ is calculated from the information set I as the set of entries of I comprised for the values in the current decoding window defined by t. The values of $I_t$ are the values of I between $$(t-1) \cdot \frac{M}{2} + 1$$

and $t \cdot M/2$ reduced by $(t-1) \cdot M/2$; obviously, $K_t = |I_t|$. This sub-information set will be used as the information set of a polar code having a classical polar code transformation matrix $T_{M/2}$.

The next step is to extract sub-channel LLRs $L_1$ and $L_2$ from the received signal values y. The M/2 LLRs for this decoder are calculated as follows on the basis of y: the vector $$L_1 = \left[ y\left((1-1) \cdot \frac{M}{2} + 1\right), \ldots, y\left(t \cdot \frac{M}{2}\right) \right] \qquad -7$$

is extracted from y, while a second vector $L_2$ of length M/2 is calculated as $$L_2(i) = \begin{cases} y\left(t \cdot \frac{M}{2}\right) + i, & t < 2S \\ \infty, & t = 2S \end{cases} \qquad -8$$

The first and second sub-channel LLRs $L_1$ and $L_2$ are then used in step 1604 to derive the channel LLRs L. The channel LLRs L to be used for the current decoding step are calculated on the basis of these two vectors as $$L = (L_0 + L_1) \boxplus L_2 \qquad\qquad -9$$

where $$A \boxplus B \stackrel{\Delta}{=} 2\tanh^{-1}\left(\tanh\frac{A}{2} \cdot \tanh\frac{B}{2}\right) \cong \operatorname{sign}(A) \cdot \operatorname{sign}(B) \cdot \min(|A|, |B|).$$

This is derivable from the update rules for existing successive cancellation decoding according to equation (5) set out above when applied to the branches of the Tanner graph of the decoding box $W_{2S}$.

Next, at steps 1705 and 1706 the $(M/2, K_t)$ polar code defined by $I_t$ is decoded via SC decoding using L as channel LLRs and based on the Tanner graph for the classical polar code $T_{M/2}$ block. Successive cancellation decoding results in a sub-input vector $u_t$ (step 1605). In SC decoding, the hard decisions made on the bits of the sub-input vector $u_t$ are further used to calculate the partial sums $x_t$ used in the SC decoding such that $x_t = u_t \cdot T_{M/2}$. Accordingly, the SC decoding provides both $u_t$ and $x_t$ as outputs.

In step 1707, the partial sums $x_t$ are then used to update the upper LLRs $L_0$ as $$L_0 = (L_0 + L_1) \cdot (1 - 2x_t) \qquad\qquad -10$$

Again, this is based on the classical successive decoding update rules when applied to the nodes of the Tanner graph of the $W_{2S}$ block, specifically update equation 6 mentioned above.

Further, at step 1708 it is determined if $t=2S$. If $t=2S$, decoding is concluded, and input vector u is calculated at step 1709 by appending all the decoded sub input vectors to form $u = [u_1 \; u_2 \; \ldots \; u_{2S}]$.

If at step 1708 it is determined that t is not equal to 2S then the process returns to step 1702 t is incremented by 1 at step 1710 and another decoding step is performed. The increment of the value of t by 1 having the effect of shifting a decoding window by M/2 values to the right other than for the last position where the $L_1$ values are the last M/2 values of the received signal and the $L_2$ values are taking as infinity. Accordingly, as will be appreciated, standard a successive cancellation decoder may be used to decode received signal values of a codeword encoded according the earlier described embodiments of a multi-kernel polar code.

An example of a decoding process using successive decoding will now be described when applied to a polar code where N=16 as per the example code generation and encoding example shown in FIGS. 7 to 12 and already described above. Assume that the following polar encoded binary sequence from the encoding example above, has been generated and is transmitted over a channel:

$u$=[0001 0001 $\overline{0}\,\overline{0}$ 1 0 0 0 0 1]

$x=u\cdot T$=[0 1 0 1 1 0 1 0 0 1 0 1 1 1 1 1]

In the initialization step the following are received as the channel LLRs, $y$={1.3,−0.2,0.5,$\underline{0.2}$,−1.1,0.7,−0.5,1.1,0.8,$\underline{0.5}$,1.0,−0.4,−1.0,−$\underline{0.8}$,−1.4,−0.6} and the following as the information set, $I$={4,8,11,12,13,14,15,16} further the M/2=4 LLR buffer values (upper LLR values) are set to zero such that $L_0$=[0 0 0 0]

The channel LLR values shown in underline have a sign error due to the noise in the channel. As will be demonstrated the error correcting properties of the polar code will allow the correct input vector u and encoded bit values x to be decoded from the channel LLRs.

FIGS. 18a to 18d show an example embodiment in which a Tanner graph becomes populated with determined values at each of four decoding stages t=1 . . . 4. Considering first of all t=1 and FIG. 18a, from the received values y, $L_1$={1.3, −0.2, 0.5, 0.2} and $L_2$={−1.1, 0.7, −0.5, 1.1}. The $L_1$ and $L_2$ values are propagated across the permutation network 904 such that they are provided to the first and second rows of the W4 decoding blocks 904-1 . . . 904-4 respectively. Because there is no upper LLRs for the first iteration the buffer $L_0$ is zero and $L_0+L_1=L_1$, and thus the channel LLRs are L=$L_1 \boxplus L_2$={−1.1, −0.2, −0.5, 0.2}. The channel LLRs L are propagated across the permutation network 903 such that are provided at the outputs of the first $T_4$ polar coding block 902-1. Thus, these values can be successively decoded across the polar coding block using the sub information set $I_1$={4}. The resulting decoded sub-input vector $u_1$=[0 0 0 1] and the partial sum values $x_1$=[1 1 1 1]. The partial sum values propagate from left-to-right and are used to update the upper LLR buffer according to $L_0=(L_0+L_1)\cdot(1-2x_1)=L_1\cdot(1-2x_1)$={−1.3, 0.2, −0.5, −0.2}.

Figure 18A:
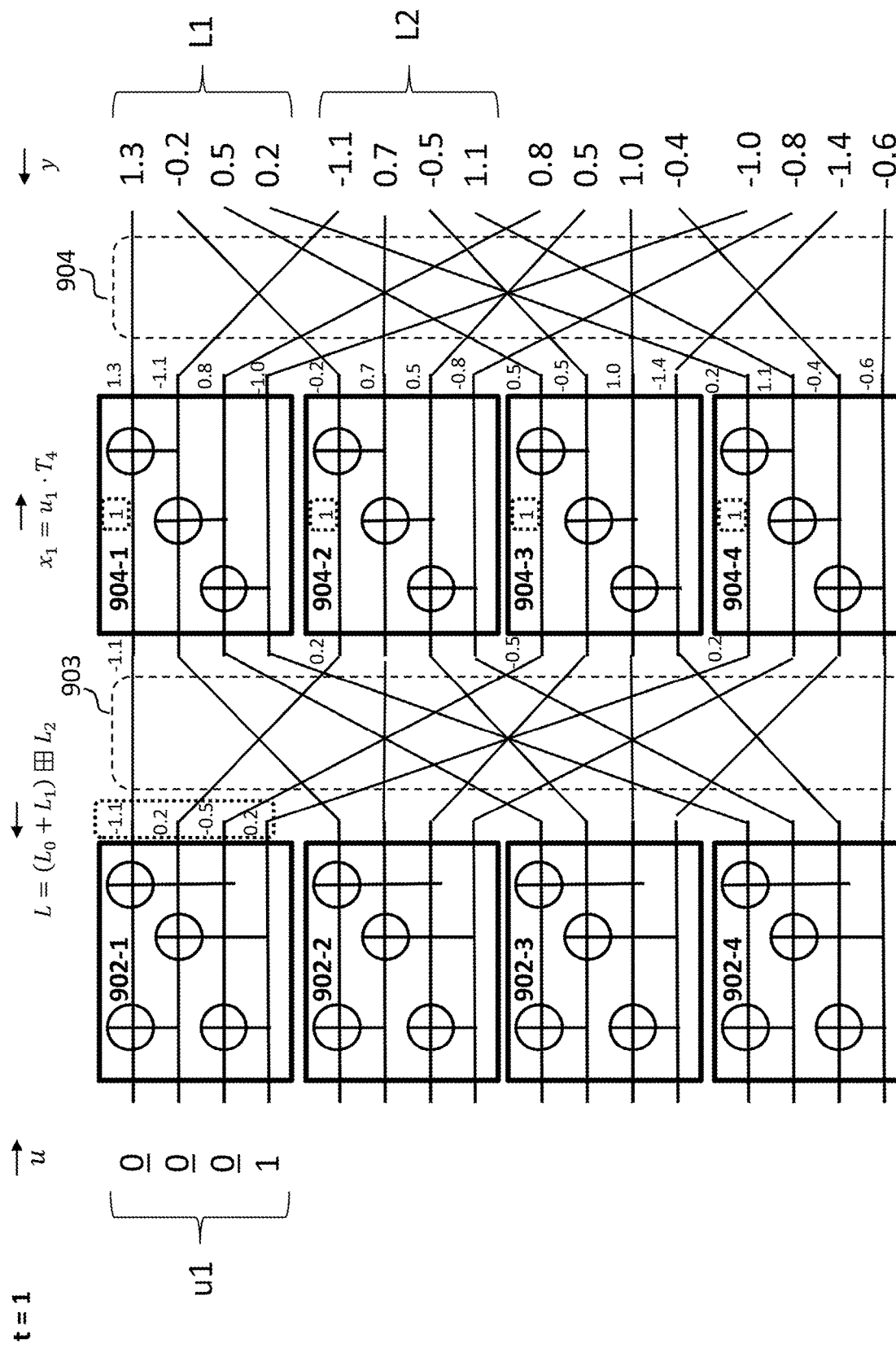
FIG. 18a shows a Tanner graph of a Polar code according to an embodiment of the present disclosure showing the propagation of values in a first decoding step.
Figure 18B:
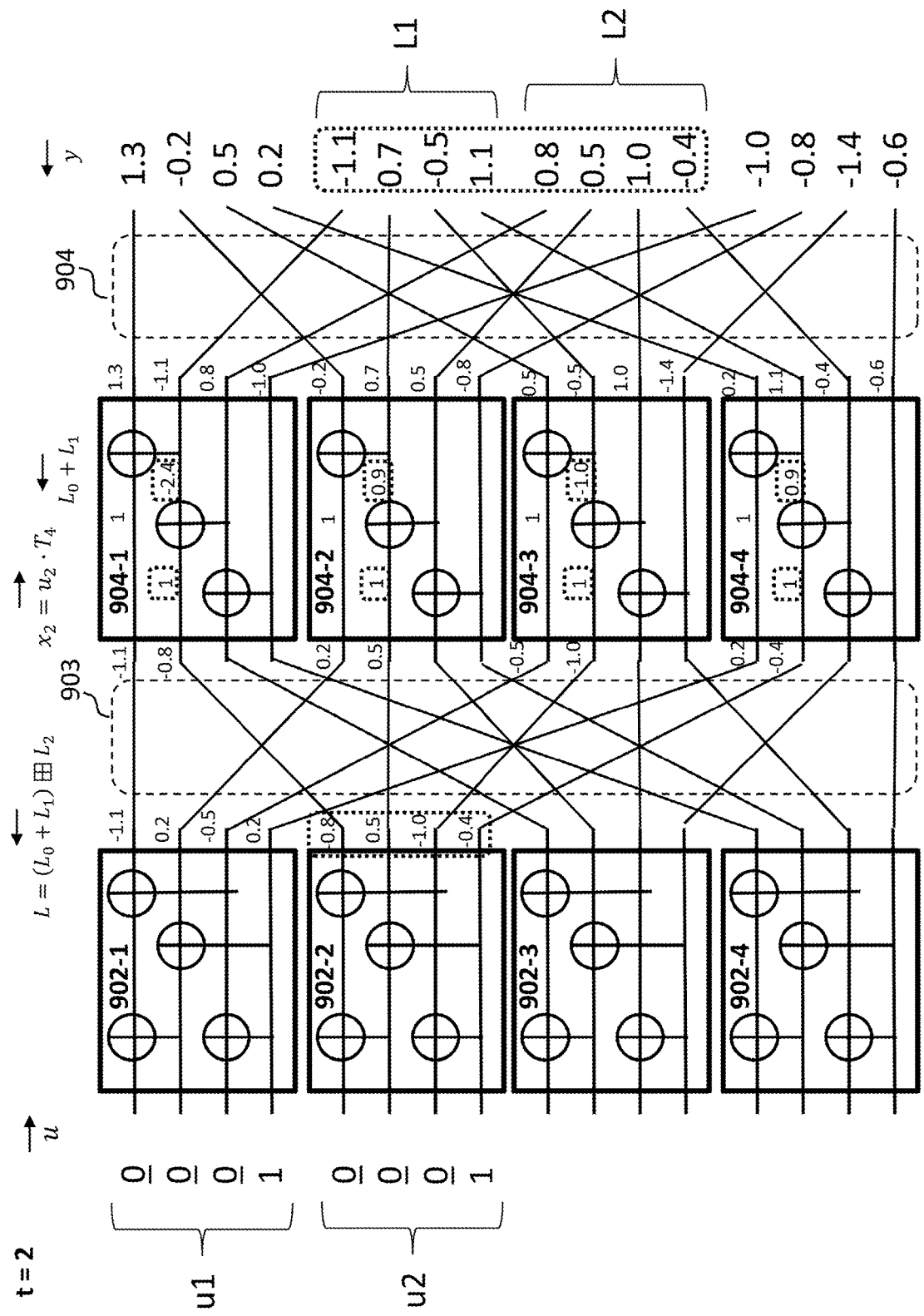
FIG. 18b shows a Tanner graph of a Polar code according to an embodiment of the present disclosure in which the the propagation of values in a second decoding step is shown.

At the next stage t=2 shown in FIG. 18b. The decoding window is shifted by 4 values and the sub-channel LLRs become $L_1$={−1.1, 0.7, −0.5, 1.1} and $L_2$={0.8, 0.5, 1.0, −0.4}. The $L_1$ and $L_2$ values are propagated across the permutation network 904 such that they are provided to the second and third rows of the W4 decoding blocks 904-1 . . . 904-4 respectively. The buffer $L_0$ updated at the end of the first stage is equal to {−1.3, 0.2, −0.5, −0.2} and, thus $L_0+L_1$={−2.4, 0.9, −1.0, 0.9}.

Thus, the channel LLRs are L=$(L_0+L_1)\boxplus L_2$={−1.1, −0.2, −0.5, 0.2}. The channel LLRs L are propagated across the permutation network 903 such that are provided at the outputs of the second $T_4$ polar coding block 902-2. Again, these values are successively decoded across the polar coding block using the sub information set $I_2$={4} derived from the information set I values that correspond to the bit positions of the second sub-input vector. The resulting decoded sub-input vector is $u_2$=[0 0 0 1] and the partial sum values $x_2$=[1 1 1 1]. The update of the upper LLR buffer proceeds according to $L_0=(L_0+L_1)\cdot(1-2x_2)$={−1.3, 0.2, −0.5, −0.2}.

Figure 18C:
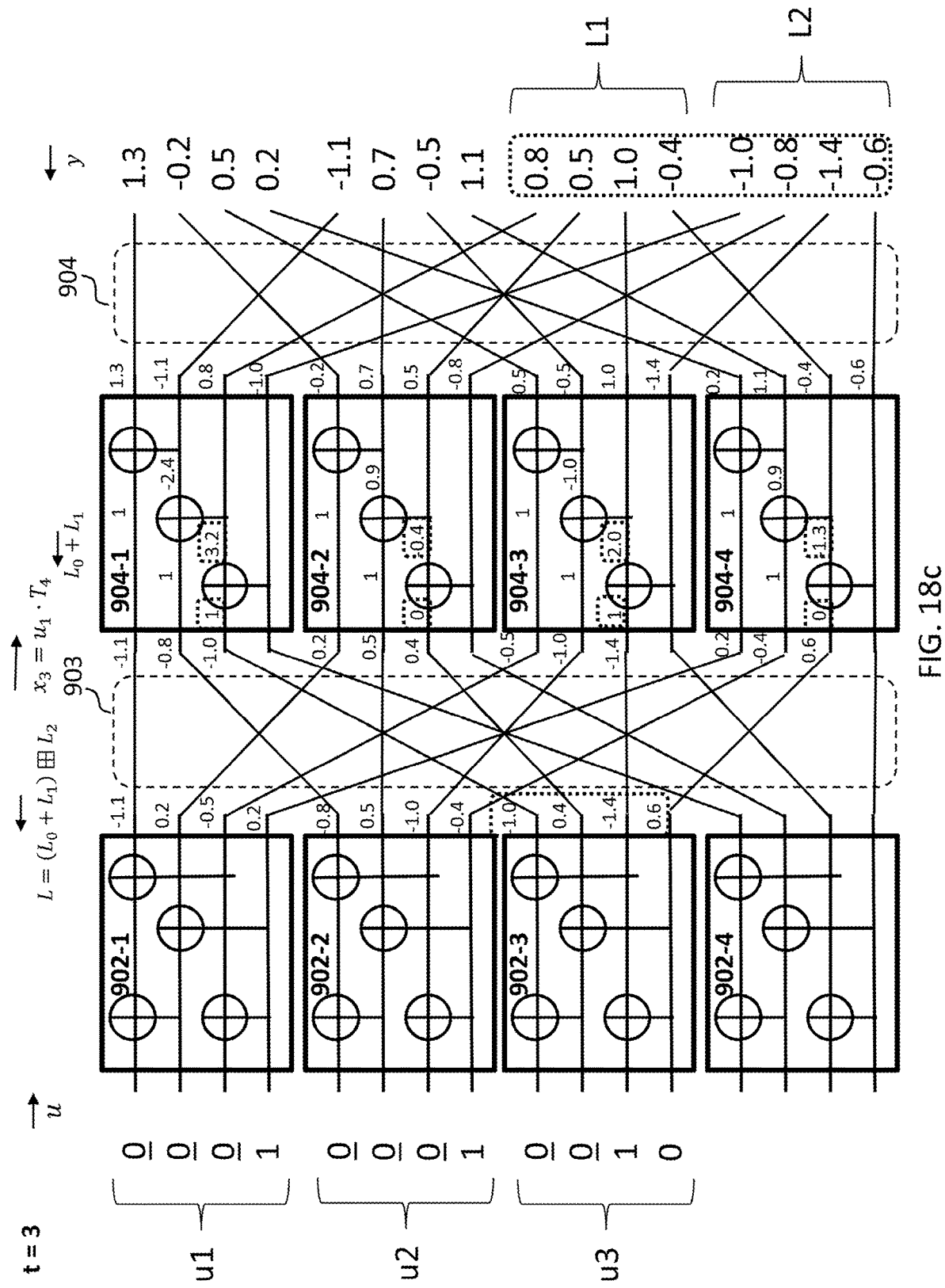
FIG. 18c shows a Tanner graph of a Polar code according to an embodiment of the present disclosure in which the propagation of values in a third decoding step is shown.
Figure 18D:
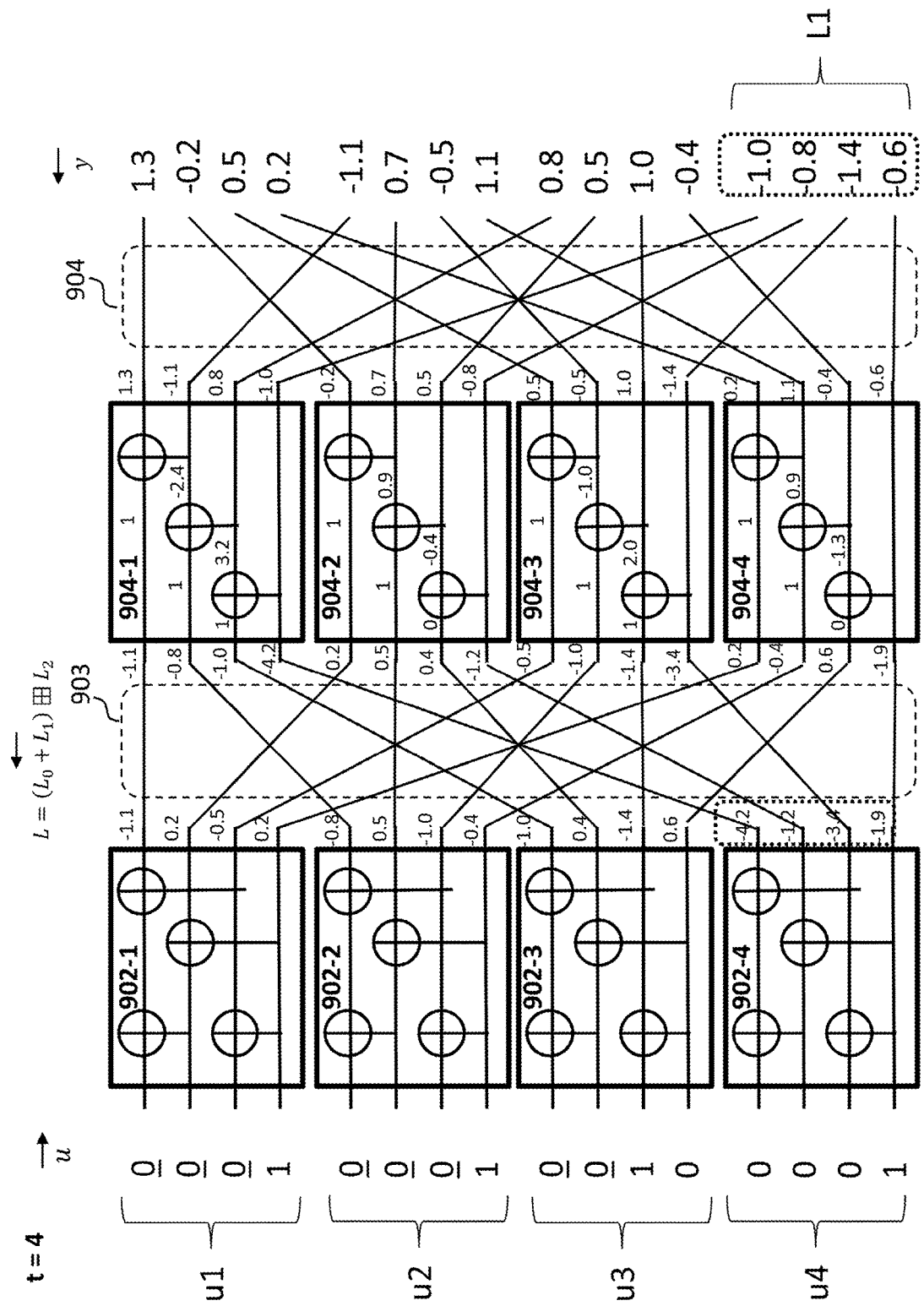
FIG. 18d shows a Tanner graph of a Polar code according to an embodiment of the present disclosure in which the propagation of values in a fourth decoding step is shown.

The third stage t=3 is shown in FIG. 18c. The decoding window is shifted by 4 values and the sub-channel LLRs become $L_1$={0.8, 0.5, 1.0, −0.4} and $L_2$={−1.0, −0.8, −1.4, −0.6}. The $L_1$ and $L_2$ values are propagated across the permutation network 904 such that they are provided to the third and fourth rows of the W4 decoding blocks 904-1 . . . 904-4 respectively. The buffer $L_0$ is {−1.3, 0.2, −0.5, −0.2} from the previous update and, thus, $L_0+L_1$={3.2, −0.4, 2.0, −1.3}.

Thus, the channel LLRs are derived as L=$(L_0+L_1)\boxplus L_2$={−1.0, 0.4, −1.4, 0.6}. The channel LLRs L are propagated across the permutation network 903 such that are provided at the outputs of the third $T_4$ polar coding block 902-3. Again, these LLR values are used to perform successive decoding across the polar coding block using the sub information set $I_3$={3, 4} derived from the information set I values that correspond to the bit positions of the second sub-input vector. The resulting decoded sub-input vector is $u_3$=[0 0 0 1] and the partial sum values $x_3$=[1 1 1 1]. The update of the upper LLR buffer proceeds according to $L_0=(L_0+L_1)\cdot(1-2x_3)$={−3.2, −0.4, −2.0, −1.3}. Decoding then proceeds to the final stage t=4, effectively the window is shifted so that only the last four values are within the decoding window. This means that the sub-channel LLRs become $L_1$={−1.0, −0.8, −1.4, −0.6} and $L_2$={∞, ∞, ∞, ∞}. The $L_1$ values are propagated across the permutation network 904 such that they are provided to fourth rows of the W4 decoding blocks 904-1 . . . 904-4 respectively. The buffer $L_0$ is {−3.2, −0.4, −2.0, −1.3} and, thus, $L_0+L_1$={−4.2, −1.2, −3.4, −1.9}.

Thus, the channel LLRs are derived as L=$(L_0+L_1)\boxplus L_2$={−4.2, −1.2, −3.4, −1.9}. The channel LLRs L are propagated across the permutation network 903 such that are provided at the outputs of the third $T_4$ polar coding block 902-3. Again, these LLR values are used to perform successive decoding across the polar coding block using the sub information set $I_4$={1,2,3,4} derived from the information set I values that correspond to the bit positions of the second sub-input vector. The resulting decoded sub-input vector is $u_4$=[0 0 0 1]. As this is the final decoding step, the steps of determining the partial sum values $x_4$ and updating the buffer $L_0$ are redundant and may be omitted.

The derived sub-input vectors $u_1$=[0 0 0 1], $u_2$=[0 0 0 1], $u_3$=[0 0 0 1], $u_4$=[0 0 0 1] may be concatenated and the decoded input vector u is

[0 0 0 1 0 0 0 1 0 0 1 0 0 0 0 1]

From the information set I, the decoded message is thus, $m$=[1 1 1 0 0 0 0 1]

and matches the message as originally encoded using the generated multi-kernel polar code according to this embodiment.

Figure 19:
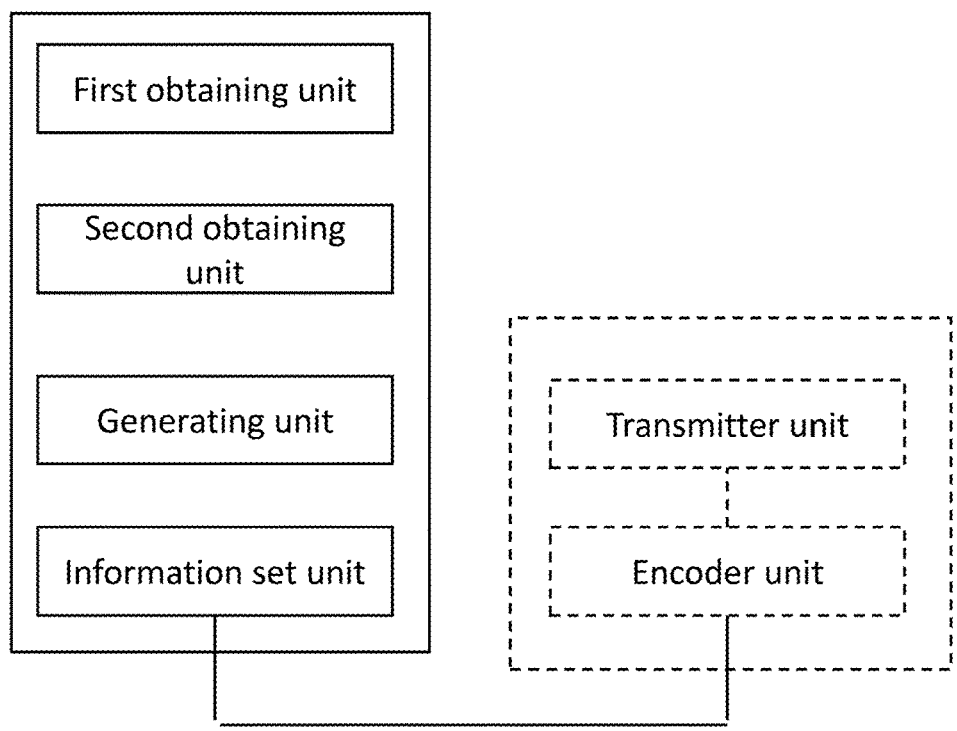
FIG. 19 shows an apparatus for generating a Polar code according to an embodiment of the present disclosure.

FIG. 19 is a block diagram of an apparatus for generating a Polar code according to an embodiment of the present disclosure. An apparatus 1900 shown in FIG. 19 includes an a first obtaining unit 1901, a second obtaining unit 1902, a generating unit 1903 and an information set unit 1904.

The first obtaining unit 1901 obtains a first matrix as an m-fold Kronecker product of a 2×2 binary lower triangular matrix where m=log 2(M/2), M<N, and N is the length of a polar code to be generated.

The second obtaining unit 1902 obtains a second matrix of dimension 2S×2S, where S=N/M and the inverse of the second matrix is a lower triangular band matrix.

The generating unit 1903 generates a transformation matrix for the polar code by calculating a Kronecker product of the second matrix with the first matrix.

The information set unit 1904 determines an information set I identifying reliable bit channels for the polar code.

The selection by the first and second selecting units is such that a polar codeword of length N may be obtained using the polar code that is decodable by iteratively applying a sliding decoding window of length M to the polar codeword, where M<N.

Additionally, an encoder 1910 may be provided that receives the polar code from the apparatus 1900 and uses it to encode a message to be transmitted on a communications channel. Further, a transmitter 1920 may be provided (that may include an antenna) that is capable of transmitted the encoded message data across a channel e.g. by modulating a signal and transmitting it via an antenna.

The apparatus 1900, 1910 and 1920 shown in FIG. 19 can implement each step of the method shown in FIGS. 3-10. To avoid repetition, detailed description is not repeated. The apparatus for generating a Polar code 1900, the encoder 1910 and the transmitter 1920 may be embodied on a base station element of a communications network or user equipment such as a smart phone or tablet.

Figure 20:
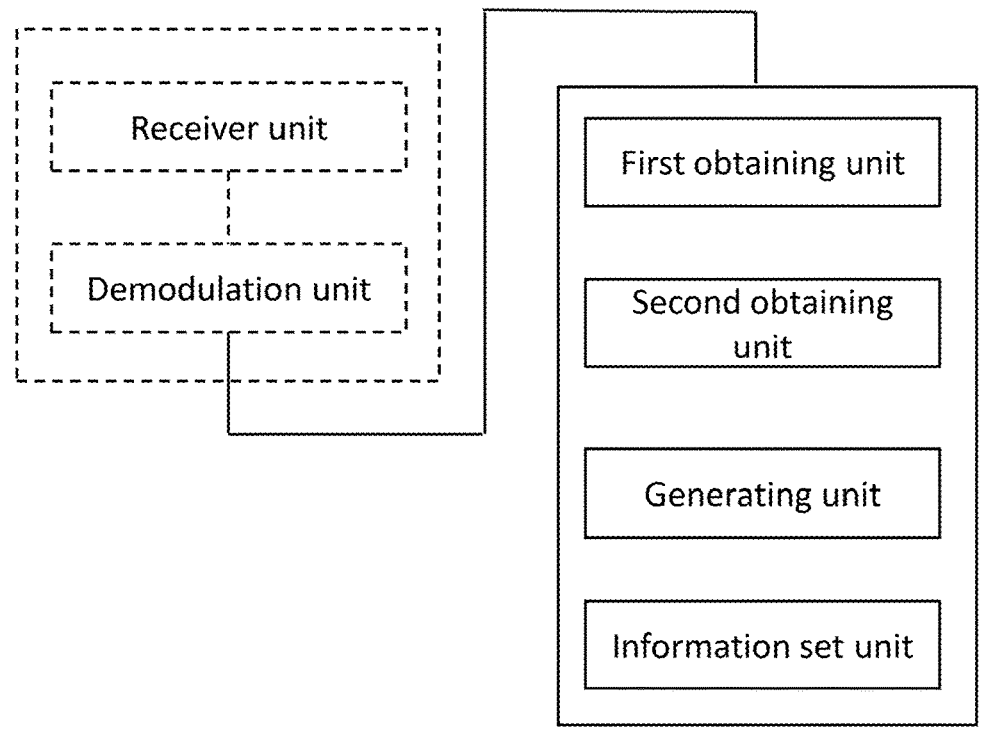
FIG. 20 shows an apparatus for decoding received signal values according to an embodiment of the present disclosure.

FIG. 20 is a block diagram of an apparatus for decoding a received signal according to an embodiment of the present disclosure. The apparatus 2000 shown in FIG. 20 includes a window unit 2001, a first decoding unit 2002, a shifting unit 2003, a likelihood obtaining unit 2004 and a second decoding unit 2005.

The window unit 2001 applies at a first position, a window of length M to a received signal containing N signal values, where M<N.

The first decoding unit 2002 decodes a first sub-input vector using a polar code and first channel likelihoods L based on signal values obtained from the window at the first position.

The shifting unit 2003 shifts the window position to second position.

The channel likelihood obtaining unit 2004 obtains second channel likelihoods L based on the signal values from the window at the second position and the decoded first sub-input vector.

The second decoding unit 2005 decodes a second-sub-input vector using a polar code and the second channel likelihoods.

A receiver 2020 may be provided that receives a signal to be decoded e.g. via a communications network and provides it to the apparatus 2000. A demodulator 2010 may be provided that demodulates the signal received at the receiver 2020 before providing it to the apparatus 2000 for decoding.

The apparatus 2000, 2010 and 2020 shown in FIG. 20 can implement each step of the method shown in FIGS. 15-17 and 18a-18d. To avoid repetition, detailed description is not repeated. The apparatus 2000, 2010, and 2020 may be located in any network element, for example, may be located in a user equipment or a base station.

Figure 21:
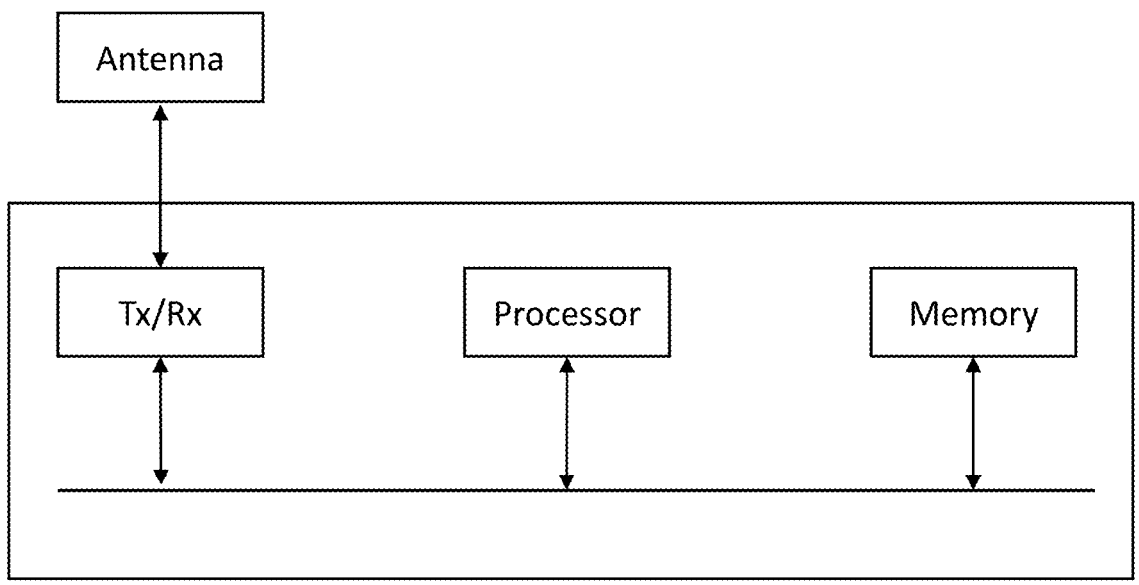
FIG. 21 shows apparatus for implementing embodiments according to the present disclosure.

FIG. 21 is a schematic block diagram of an apparatus according to another embodiment of the present disclosure. An apparatus 2100 shown in FIG. 21 may be configured to implement each step and method in the foregoing method embodiments. The apparatus 2100 may be applied to a base station or a terminal in various communications systems. In an embodiment shown in FIG. 21, the apparatus 2100 includes a processing unit (including one or more processors) 2101, a memory 2102, a transmitter/receiver circuit 2103, and an antenna 2104. The processing unit 2101 controls an operation of the apparatus 2100, and may also be called a CPU (central processing unit). The memory 2102 may include a read-only memory and a random-access memory (RAM), and provides an instruction and data for the processing unit 2101. A part of the memory 2102 may further include a nonvolatile random-access memory (NVRAM). In an actual application, the apparatus 2100 may be embedded into or may be a wireless communications device such as a mobile phone or other portable communications device such as a smart phone or tablet. The transmitter/receiver circuit 2103 may be coupled to the antenna 2104. Components of the apparatus 2100 are coupled together through a bus system 2105, where the bus system 2105 may further include a power bus, a control bus, and a status signal bus, in addition to a data bus. However, for clear description, all buses are marked as the bus system 2105 in FIG. 21.

The method disclosed in the embodiments of the present disclosure may be applied in processing unit 2101. In a process of implementation, each step of the method may be completed by using an integrated logic circuit of hardware in the processing unit 2101 or instructions in a software form. These instructions may be implemented and controlled by using the processing unit 2101. Configured to execute the method disclosed in the embodiments of the present disclosure, the foregoing processing unit may include a general-purpose processor, a digital signal processor (DSP), an application-specific integrated circuit (ASIC), a field-programmable gate array (FPGA), or another programmable logic device, a discrete gate or transistor logic device, or a discrete hardware component; and can implement or execute each disclosed method, step, and logic block diagram in the embodiments of the present disclosure. The general-purpose processor may be a microprocessor or the processor may be any common processor or decoder, and so on. The step with reference to the method disclosed in the embodiments of the present disclosure may be directly executed and completed by a hardware decoding processor or executed and completed by a combination of hardware and a software module in a decoding processor. The software module may be located in a mature storage medium in the art, such as a random-access memory, a flash memory, a read-only memory, a programmable read-only memory, an electronically erasable programmable memory, or a register. The storage medium is located in the memory 2102, and the processing unit 2101 reads information in the memory 2102, and completes the steps of the method with reference to the hardware. For example, the memory 2102 may store information about an obtained Polar code or frozen or information set for the processing unit 2101 to use during encoding or decoding.

A communications system or a communications apparatus according to an embodiment of the present disclosure may include the apparatus 1900 the apparatus 2000 or the apparatus 2100.

The block error rate (BLER) performance of the sliding window design and decoding of polar codes in embodiments of the disclosure may be compared with independent block transmission and optimal full polar code transmission. Specifically, we consider the scenario where the transmitter has to send K bits to the receiver at a rate R=K/N, i.e. it should transmit N bits, however the receiver can handle only M<N bit per reception due to limited decoding capabilities.

We compare 3 strategies:

State-of-the-art independent transmission (IND): A transmitter divides the K message bits into S=N/M messages of K'=K/S bits, that are encoded and transmitted independently using S polar codes of length M and dimension K'. Transmission is successful if all S blocks are decoded correctly.

Best case full polar code (FULL): A transmitter ignores the limitations at the receiver and transmits a codeword obtained using the full (N, K) polar code. This case is used as a benchmark of the best possible BLER performance attainable by polar codes in the transmission.

A sliding window decoding (SW) process as according to the above described embodiments: A transmitter designs and encode a polar codeword according to the already described code generation and encoding embodiments. A receiver uses a decoding process according to the above embodiment i.e. FIGS. 15 and 17.

Figure 22:
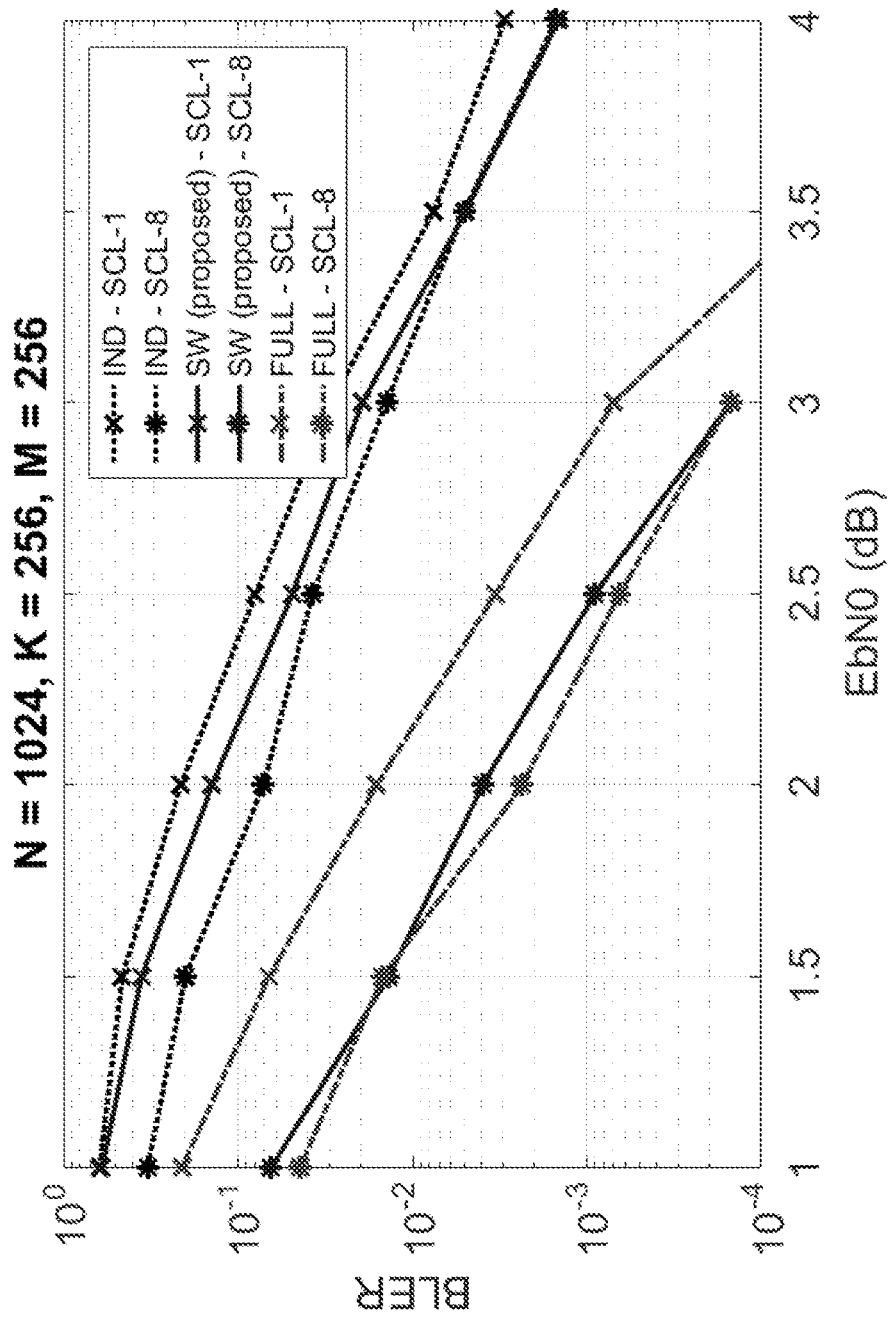
FIG. 22 shows a first simulation result according to embodiments of the present disclosure.
Figure 23:
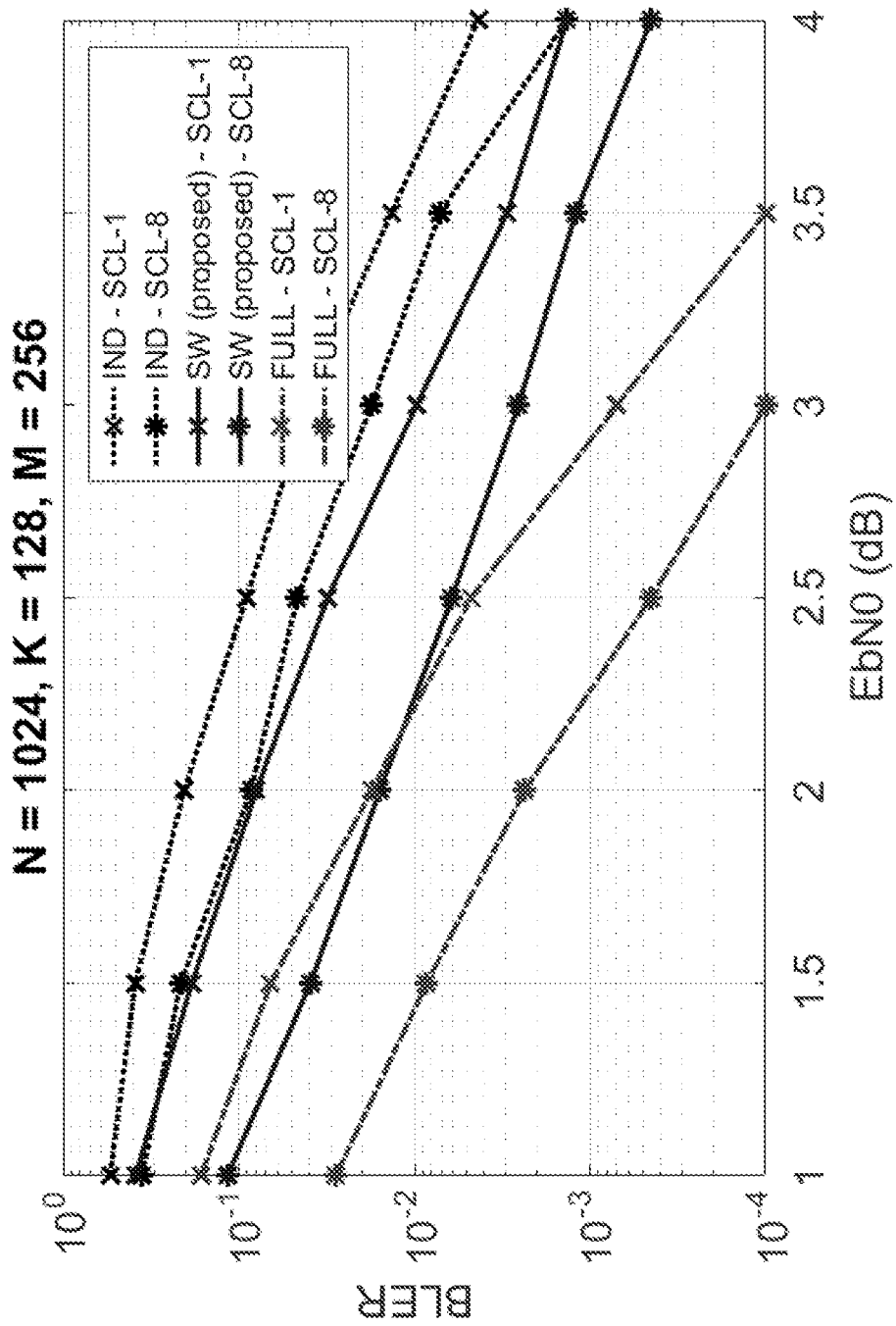
FIG. 23 shows a second simulation result according to embodiments of the present disclosure.
Figure 24:
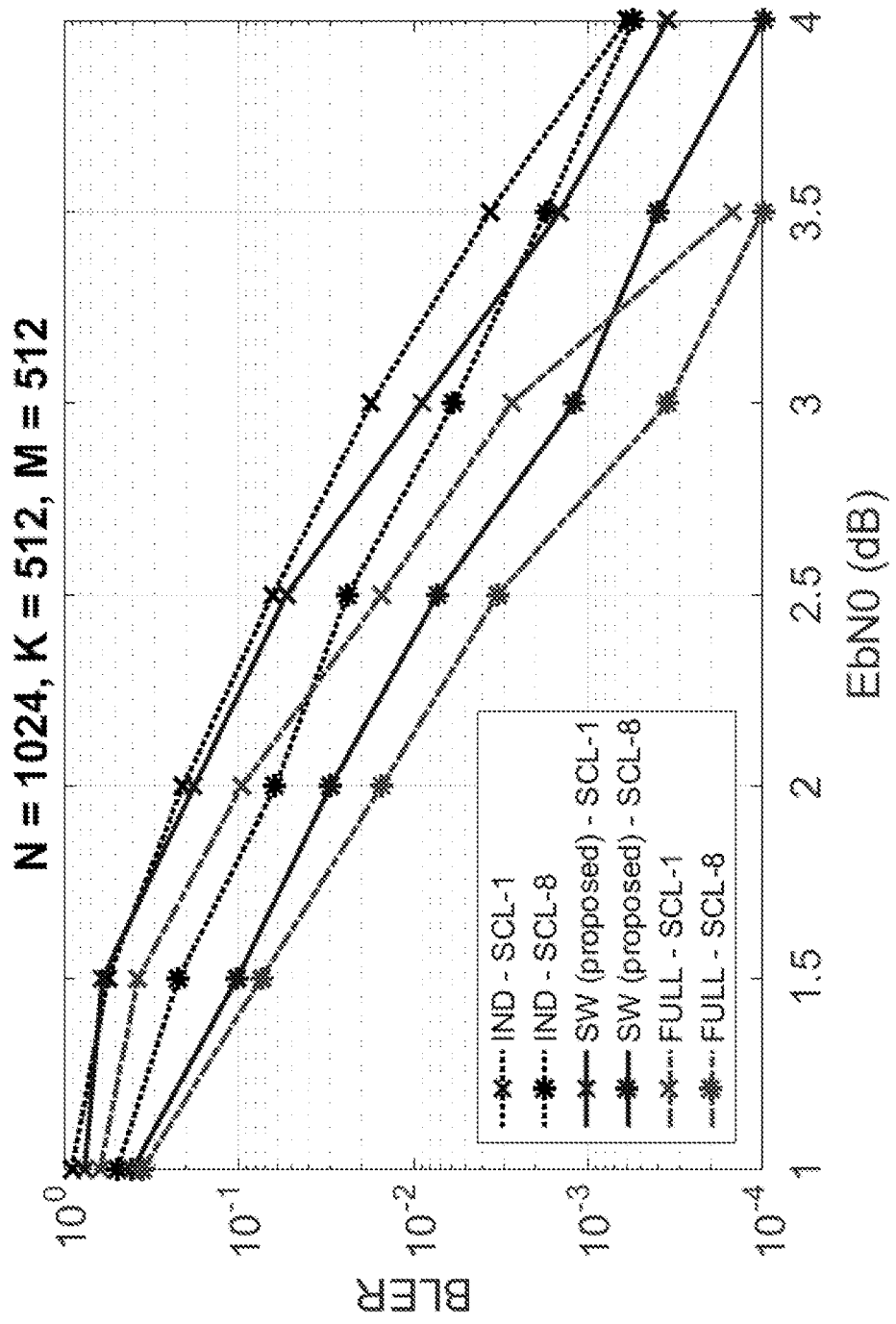
FIG. 24 shows a third simulation result according to embodiments of the present disclosure.

In the following, we show a performance result under SC (SCL-1 in the figures) and SCL decoding. FIG. 22 studies the case where N=1024, K=256 and M=256, i.e. having a rate R=1/4, while FIG. 23 studies a similar scenario where K=128 and the rate is R=1/8. FIG. 22 shows that proposed solution slightly outperforms IND under SC decoding, but is far away from full polar code; this gap is annulled under SCL, while IND is not able to improve its performance. FIG. 23 shows that proposed solution permits up to 1 dB gain over state-of-the-art, even if results are still far from optimality. Finally, FIG. 24 studies the case where N=1024, K=512 and M=512, i.e. having a rate R=1/2. In this case, gain is still around 1 dB over IND. In general, the simulations show that embodiments of the disclosure always provide a better block error rate than existing solutions, and in some cases may even reach optimal BLER performance.

A person of ordinary skill in the art may be aware that, in combination with the examples described in the embodiments disclosed in this specification, units and algorithm steps may be implemented by electronic hardware, or a combination of computer software and electronic hardware. Whether the functions are performed by hardware or software depends on particular applications and design constraint conditions of the technical solutions. A person skilled in the art may use different methods to implement the described functions for each particular application, but it should not be considered that such implementation goes beyond the scope of the present disclosure.

It may be clearly understood by a person skilled in the art that, for the purpose of convenient and brief description, for a detailed working process of the foregoing system, apparatus, and unit, reference may be made to the corresponding process in the foregoing method embodiments, and details are not described herein again.

In the embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communications connections may be implemented through some interfaces. The indirect couplings or communications connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present disclosure essentially, or the part contributing to the prior art, or apart of the technical solutions may be implemented in the form of a software product. The computer software product is stored in a storage medium, and includes several instructions for instructing a computer device (which may be a personal computer, a server, or a network device) to perform all or a part of the steps of the methods described in the embodiments of the present disclosure. The foregoing storage medium includes: any medium that can store program codes, such as a USB flash drive, a removable hard disk, a read-only memory (ROM), a random access memory (RAM), a magnetic disk, or an optical disc.

The present disclosures can be embodied in other specific apparatus and/or methods. The described embodiments are to be considered in all respects as illustrative and not restrictive. In particular, the scope of the disclosure is indicated by the appended claims rather than by the description and figures herein. All changes that come within the meaning and range of equivalency of the claims are to be embraced within their scope.

What is claimed is:

1. An encoding method performed by an encoder, the method comprising:
   obtaining a first matrix as an m-fold Kronecker product of a 2×2 binary lower triangular matrix, where m=log 2(M/2), M<N, and N is the length of a polar code to be generated;
   obtaining a second matrix of dimension 2S×2S, where S=N/M and an inverse of the second matrix is a lower triangular band matrix;
   generating a transformation matrix for the polar code by calculating a Kronecker product of the second matrix with the first matrix;
   determining an information set I identifying reliable bit channels for the polar code;
   obtaining a polar codeword of length N using the polar code; and
   transmitting a transmission signal comprising the polar codeword to a receiving device.

2. The method according to claim 1, wherein the polar codeword is decodable by iteratively applying a sliding decoding window of length M to the polar codeword.

3. The method according to claim 2, where a successive decoding process using a polar code of size M/2 is applied to the windowed polar codeword during each iteration of the successive decoding process.

4. The method according to claim 1, wherein determining the information set comprises:
   estimating bit-error probability and/or log-likelihood ratios of first and second kernels having i bit channels, corresponding to the first and second matrices.

5. The method according to claim 1, wherein the second matrix is a full binary lower triangular matrix.

6. The method according to claim 1, wherein the step of obtaining the polar codeword of length N using the polar code comprises:
inserting K message bits into an input vector u according to the reliable bit channels identified by the information set I; and
generating a polar codeword using the input vector u by calculating the product of the input vector and the transformation matrix.

7. The method according to claim 1, wherein the step of obtaining the polar codeword of length N using the polar code comprises:
inserting K message bits into an input vector u according to the reliable bit channels identified by the information set I of the polar code of length N;
dividing the input vector u into 2S sub-input vectors of size M/2;
encoding the sub-input vectors using the first matrix; and
iteratively adding respective bits of one or more encoded sub-input vectors to an immediately preceding encoded sub-input vector.

8. An encoding apparatus, comprising one or more processors and a memory storing instructions, wherein when the one or more processors execute the instructions in the memory, the one or more processors are configured to:
obtain a first matrix as an m-fold Kronecker product of a 2×2 binary lower triangular matrix, where m log 2(M/2), M<N, and N is the length of a polar code to be generated;
obtain a second matrix of dimension 2S×2S, where S=N/M and an inverse of the second matrix is a lower triangular band matrix;
generate a transformation matrix for the polar code by calculating a Kronecker product of the second matrix with the first matrix;
determine an information set I identifying reliable bit channels for the polar code;
obtain a polar codeword of length N using the polar code; and
transmit a transmission signal comprising the polar codeword to a receiving device.

9. The apparatus according to claim 8, wherein the polar codeword is decodable by iteratively applying a sliding decoding window of length M to the polar codeword.

10. The apparatus according to claim 9, wherein a successive decoding process using a polar code of size M/2 is applicable to the windowed polar codeword during each iteration of the successive decoding process.

11. The apparatus according to claim 8, wherein the one or more processors are further configured to:
estimate bit-error probability and/or log-likelihood ratios of first and second kernels having i bit channels, corresponding to the first and second matrices.

12. The apparatus according to claim 8, wherein the second matrix is a full binary lower triangular matrix.

13. The apparatus according to claim 8, wherein the one or more processors are further configured to:
insert K message bits into an input vector u according to the reliable bit channels identified by the information set I; and
generate a polar codeword using the input vector u by calculating the product of the input vector and the transformation matrix.

14. The apparatus according to claim 8, wherein the one or more processors are further configured to:
insert K message bits into an input vector u according to the reliable bit channels identified by the information set I of the polar code of length N;
divide the input vector u into 2S sub-input vectors of size M/2;
encode the sub-input vectors using the first matrix; and
iteratively add respective bits of one or more encoded sub-input vectors to an immediately preceding encoded sub-input vector.

\* \* \* \* \*

UNITED STATES PATENT AND TRADEMARK OFFICE
CERTIFICATE OF CORRECTION

PATENT NO.       : 11,894,862 B2
APPLICATION NO.  : 17/566338
DATED            : February 6, 2024
INVENTOR(S)      : Bioglio et al.

It is certified that error appears in the above-identified patent and that said Letters Patent is hereby corrected as shown below:

In the Claims

Claim 8: Column 25, Line 29: "2×2 binary lower triangular matrix, where m log 2(M/" should read
-- 2×2 binary lower triangular matrix, where m= log2(M/ --.

Signed and Sealed this
Fourteenth Day of May, 2024

Katherine Kelly Vidal
*Director of the United States Patent and Trademark Office*